United States Patent
Kim et al.

(10) Patent No.: US 12,439,646 B2
(45) Date of Patent: Oct. 7, 2025

(54) OXIDE SEMICONDUCTOR DEVICE COMPRISING OXYGEN VACANCIES

(71) Applicant: Samsung Electronics Co., Ltd., Suwon-si (KR)

(72) Inventors: Teawon Kim, Hwaseong-si (KR); Hyung Joon Kim, Yongin-si (KR); Yong-Suk Tak, Seoul (KR); Yurim Kim, Suwon-si (KR); Kongsoo Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 599 days.

(21) Appl. No.: 17/697,423

(22) Filed: Mar. 17, 2022

(65) Prior Publication Data

US 2023/0052762 A1  Feb. 16, 2023

(30) Foreign Application Priority Data

Aug. 13, 2021 (KR) ............ 10-2021-0107127

(51) Int. Cl.
*H10D 30/67* (2025.01)
*H10D 86/40* (2025.01)
*H10D 86/60* (2025.01)

(52) U.S. Cl.
CPC ....... *H10D 30/6755* (2025.01); *H10D 30/673* (2025.01); *H10D 86/423* (2025.01); *H10D 86/60* (2025.01)

(58) Field of Classification Search
CPC ........... H01L 29/7869; H01L 29/42384; H01L 29/78642; H01L 29/78696; H01L 29/24; H01L 29/7827; H01L 29/78606; H01L 27/1225; H10D 86/423; H10D 86/60; H10D 62/80; H10D 30/6755; H10D 30/673; H10D 30/6728; H10D 30/6757; H10D 30/63; H10D 30/6704
See application file for complete search history.

(56) References Cited

U.S. PATENT DOCUMENTS

| | | | |
|---|---|---|---|
| 8,558,382 B2 * | 10/2013 | Maeda | H01L 27/1225 257/751 |
| 9,496,406 B2 | 11/2016 | Yamazaki et al. | |
| 9,559,249 B2 | 1/2017 | Alford et al. | |
| 9,954,003 B2 | 4/2018 | Matsuda et al. | |
| 10,032,929 B2 | 7/2018 | Koezuka et al. | |
| 10,326,026 B2 | 6/2019 | Yamazaki | |
| 10,872,982 B2 | 12/2020 | Ohno et al. | |
| 2017/0236842 A1 * | 8/2017 | Matsuda | H01L 27/1225 257/43 |

* cited by examiner

*Primary Examiner* — William B Partridge
*Assistant Examiner* — Chevy J Boegel
(74) *Attorney, Agent, or Firm* — Harness, Dickey & Pierce, P.L.C

(57) ABSTRACT

Disclosed is a semiconductor device comprising an oxide semiconductor layer on a substrate and including a first part and a pair of second parts that are spaced apart from each other across the first part, a gate electrode on the first part of the oxide semiconductor layer, and a pair of electrodes on corresponding second parts of the oxide semiconductor layer. A first thickness of the first part of the oxide semiconductor layer is less than a second thickness of each second part of the oxide semiconductor layer. A number of oxygen vacancies in the first part of the oxide semiconductor layer is less than a number of oxygen vacancies in each second part of the oxide semiconductor layer.

20 Claims, 19 Drawing Sheets

OXIDE SEMICONDUCTOR DEVICE COMPRISING OXYGEN VACANCIES

CROSS-REFERENCE TO RELATED APPLICATION

This U.S. nonprovisional application claims priority under 35 U.S.C. § 119 to Korean Patent Application No. 10-2021-0107127 filed on Aug. 13, 2021 in the Korean Intellectual Property Office, the disclosure of which is hereby incorporated by reference in its entirety.

BACKGROUND

Inventive concepts relate to semiconductor devices and/or methods of fabricating the same, and more particularly, to semiconductor memory devices including oxide semiconductor channel transistors and/or methods of fabricating the same.

A semiconductor device may include an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performance while overcoming issues associated with high integration of the semiconductor devices.

SUMMARY

Some example embodiments of inventive concepts provide semiconductor devices including oxide semiconductor channel transistors with improved electrical characteristics and/or methods of fabricating the same.

Alternatively or additionally, some example embodiments of inventive concepts provide semiconductor devices including oxide semiconductor channel transistors capable of easily achieving high integration and methods of fabricating the same.

According to some example embodiments of inventive concepts, a semiconductor device may comprise: an oxide semiconductor layer on a substrate, the oxide semiconductor layer including a first part and a pair of second parts that are spaced apart from each other across the first part; a gate electrode on the first part of the oxide semiconductor layer; and a pair of electrodes on corresponding second parts of the oxide semiconductor layer. A first thickness of the first part of the oxide semiconductor layer may be less than a second thickness of each of the second parts of the oxide semiconductor layer. A number of, or proportion of, or concentration of oxygen vacancies in the first part of the oxide semiconductor layer may be less than a respective number of, or proportion of, or concentration of oxygen vacancies in each second part of the oxide semiconductor layer.

According to some example embodiments of inventive concepts, a semiconductor device may comprise: a conductive line on a substrate, the conductive line extending in a first direction parallel to a top surface of the substrate; a pair of oxide semiconductor layers that are spaced apart from each other in the first direction on the conductive line; a first gate electrode and a second gate electrode that are spaced apart in the first direction from each other between the pair of oxide semiconductor layers, the first and second gate electrodes running across the conductive line; and a plurality of upper electrodes that are correspondingly on the pair of oxide semiconductor layers. Each of the pair of oxide semiconductor layers may include a first part and a pair of second parts that are spaced apart from each other in a second direction perpendicular to the top surface of the substrate. A first thickness in the first direction of the first part may be less than a second thickness in the first direction of each of the second parts. A number of/proportion of/concentration of oxygen vacancies in the first part may be less than a respective number of/proportion of/concentration of oxygen vacancies in each second part.

DETAILED DESCRIPTION OF EXAMPLE EMBODIMENTS

The following will now describe in detail some example embodiments of inventive concepts with reference to the accompanying drawings.

Figure 1:
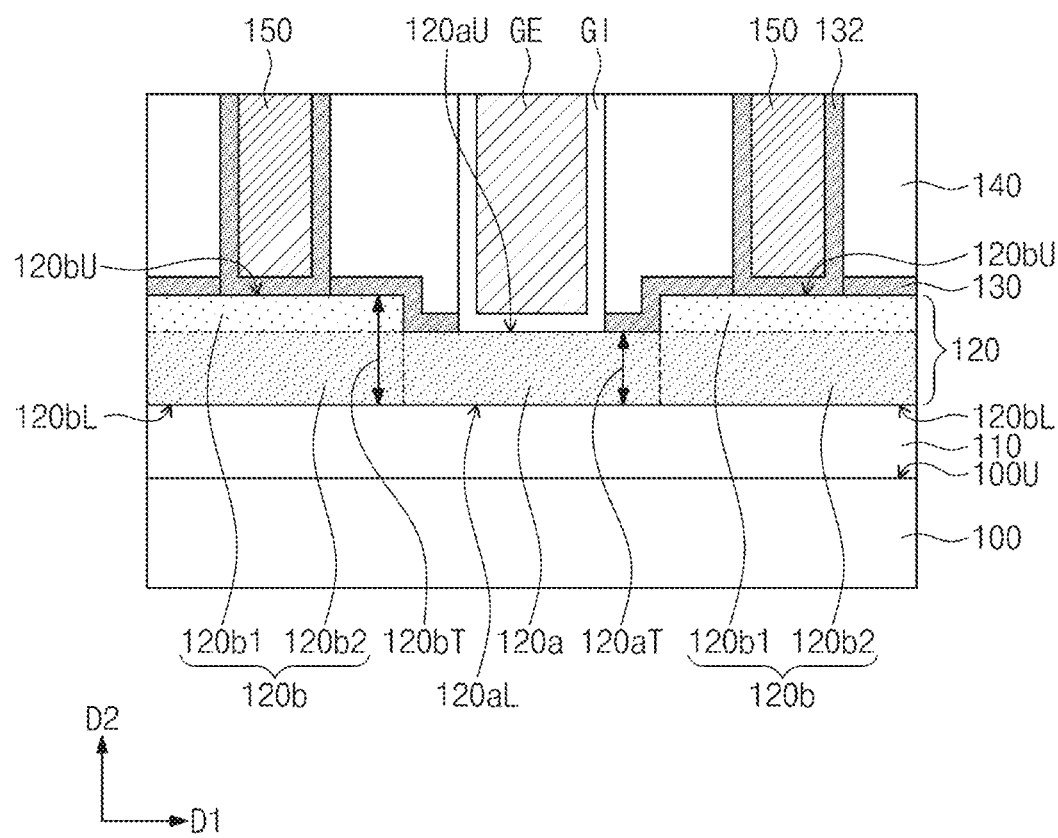
FIG. 1 illustrates a cross-sectional view showing a semiconductor device according to some example embodiments of inventive concepts.

FIG. 1 illustrates a cross-sectional view showing a semiconductor device according to some example embodiments of inventive concepts.

Referring to FIG. 1, an oxide semiconductor layer 120 may be disposed on a substrate 100, and an oxygen supply layer 110 may be disposed between the substrate 100 and the oxide semiconductor layer 120. The substrate 100 may be or may include a semiconductor substrate, for example, a silicon (Si) substrate, a germanium (Ge) substrate, a silicon-germanium (SiGe) substrate, or a silicon-on-insulator (SOI) substrate. The substrate 100 may be single-crystal and/or polycrystalline, and may or may not be doped; however, example embodiments are not limited thereto. The oxygen supply layer 110 may include an oxygen-containing dielectric material, such as silicon oxide. The oxide semiconductor layer 120 may include, for example, InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, or any combination thereof. For example, the oxide semiconductor layer 120 may include indium gallium zinc oxide (IGZO). The oxide semiconductor layer 120 may be or may include a single or multiple layer including amorphous, crystalline, and/or polycrystalline oxide semiconductor. The oxide semiconductor layer 120 may have a bandgap energy greater than that of silicon. The oxide semiconductor layer 120 may have a bandgap energy ranging from about 1.5 eV to about 5.6 eV, for example, from about 2.0 eV to about 4.0 eV.

A gate electrode GE and contact electrodes 150 may be disposed on the oxide semiconductor layer 120. The contact electrodes 150 may be disposed on opposite sides of the gate electrode GE, and may be spaced across the gate electrode GE from each other in a first direction D1 parallel to a top surface 100U of the substrate 100. The gate electrode GE may be disposed between the contact electrodes 150. The gate electrode GE may include doped polysilicon, metal, conductive metal nitride, conductive metal silicide, conductive metal oxide, or any combination thereof. The gate electrode GE may include, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. According to some example embodiments, the gate electrode GE may include a two-dimensional semiconductor material, such as graphene, carbon nano-tube, or any combination thereof. The contact electrodes 150 may include doped polysilicon, metal, conductive metal nitride, conductive metal silicide, conductive metal oxide, or any combination thereof. The contact electrodes 150 may include, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. According to some example embodiments, the contact electrodes 150 may include a two-dimensional semiconductor material, such as graphene, carbon nano-tube, or any combination thereof.

The oxide semiconductor layer 120 may include a first part 120a at least a portion below the gate electrode GE and second parts 120b (such as a pair of second parts 120b) at least a portion of which are below the contact electrodes 150. The first part 120a may be interposed between the second parts 120b and the second parts 120b may be spaced apart in the first direction D1 from each other across the first part 120a. The first part 120a may be or include or correspond to a channel region of the oxide semiconductor layer 120, and the second parts 120b may be or include or correspond to contact regions of the oxide semiconductor layer 120, on which the contact electrodes 150 are disposed. The oxide semiconductor layer 120 may have a thickness in a second direction D2 that is perpendicular to the top surface 100U of the substrate 100. The first part 120a of the oxide semiconductor layer 120 may have a first thickness 120aT less than a second thickness 120bT of each of the second parts 120b of the oxide semiconductor layer 120. A difference between the first thickness 120aT and the second thickness 120bT may be, for example, less than or equal to about 10 nm.

The first part 120a of the oxide semiconductor layer 120 may have a top surface 120aU at a height lower than that of a top surface 120bU of each of the second parts 120b of the oxide semiconductor layer 120. In this description, the term "height" may indicate a distance measured in the second direction D2 from the top surface 100U of the substrate 100. The first part 120a of the oxide semiconductor layer 120 may have a bottom surface 120aL at a height substantially the same as that of a bottom surface 120bL of each of the second parts 120b of the oxide semiconductor layer 120.

A number of, or amount of, or concentration of, or percentage of, or density of oxygen vacancies in the first part 120a of the oxide semiconductor layer 120 may be less than a respective number of or amount of or concentration of or percentage of or density of oxygen vacancies in each of the second parts 120b of the oxide semiconductor layer 120. As used herein, when reference is made to an oxygen vacancy or number of oxygen vacancies, it is to be understood that such terms refer to a concentration of or density of or percentage (volume percentage) of oxygen vacancies. Each of the second parts 120b of the oxide semiconductor layer 120 may include a lower portion 120b2 adjacent to the oxygen supply layer 110 and an upper portion 120b1 distant from the oxygen supply layer 110. A number of or amount of oxygen vacancies in the lower portion 120b2 of each of the second parts 120b may be less than a number of or amount of oxygen vacancies in the upper portion 120b1 of each of the second parts 120b. The number of oxygen vacancies in the lower portion 120b2 of each of the second parts 120b may be substantially the same as the number of oxygen vacancies in the first part 120a, and the number of oxygen vacancies in the upper portion 120b1 of each of the second parts 120b may be greater than the proportion of oxygen vacancies in the first part 120a. For example, the proportion of or percentage of oxygen vacancies in the first part 120a of the oxide semiconductor layer 120 may be equal to or less than about 5%, and the proportion of or percentage of oxygen vacancies in the lower portion 120b2 of each of the second parts 120b of the oxide semiconductor layer 120 may be equal to or less than about 5%. The proportion of oxygen vacancies in the upper portion 120b1 of each of the second parts 120b of the oxide semiconductor layer 120 may be greater than about 5%. Here, the amount of or number of or proportion of or concentration of or percentage of oxygen vacancies may be measured by various methods such as but not limited to one or more of XPS (X-ray photoelectron spectroscopy) or electron paramagnetic spectroscopy.

The gate electrode GE may be disposed on the top surface 120aU of the first part 120a of the oxide semiconductor layer 120, and the contact electrodes 150 may be correspondingly disposed on the top surfaces 120bU of the second parts 120b of the oxide semiconductor layer 120. The contact electrodes 150 may be correspondingly disposed on the upper portions 120b1 of the second parts 120b.

A plurality of first contact pads 130 may be correspondingly disposed on the top surfaces 120bU of the second parts 120b of the oxide semiconductor layer 120. A plurality of second contact pads 132 may correspondingly penetrate the first contact pads 130, and may be correspondingly interposed between the contact electrodes 150 and the top surfaces 120bU of the second parts 120b of in the oxide semiconductor layer 120. The second contact pads 132 may extend onto lateral surfaces of the contact electrodes 150. The first contact pads 130 and the second contact pads 132 may be connected to each other and constitute or correspond to a single unitary body/singly integrated unitary body. The first contact pads 130 and the second contact pads 132 may include, e.g. be of the same material. The first contact pads 130 and the second contact pads 132 may include conductive metal nitride, conductive metal oxide, or any combination thereof. For example, the first contact pads 130 and the second contact pads 132 may include TiN, indium tin oxide (ITO), or any combination thereof.

A gate dielectric pattern GI may be interposed between the gate electrode GE and the top surface 120aU of the first part 120a of the oxide semiconductor layer 120, and may extend onto lateral surfaces of the gate electrode GE. The first contact pads 130 may extend onto the top surface 120aU of the first part 120a of the oxide semiconductor layer 120, and may contact the gate dielectric pattern GI. The gate dielectric pattern GI may include silicon oxide, silicon oxynitride, high-k dielectric whose dielectric constant is greater than that of silicon, or any combination thereof. The high-k dielectric may include metal oxide and/or metal oxynitride. The high-k dielectric may include, for example, $HfO_2$, HfSiO, HfSiON, HfTaO, HfSiO, HfZrO, $ZrO_2$, $Al_2O_3$, or any combination thereof.

An interlayer dielectric layer 140 may be disposed on the oxide semiconductor layer 120, and may cover the gate electrode GE and the contact electrodes 150. The second contact pads 132 may be correspondingly interposed between the interlayer dielectric layer 140 and the contact electrodes 150, and the gate dielectric pattern GI may be interposed between the gate electrode GE and the interlayer dielectric layer 140. The interlayer dielectric layer 140 may include, for example, one or more of silicon oxide, silicon nitride, and silicon oxynitride.

The oxide semiconductor layer 120, the gate electrode GE, and the contact electrodes 150 may constitute, e.g. correspond to, or be included in, an oxide semiconductor channel transistor. The first part 120a of the oxide semiconductor layer 120 may serve as a channel of the transistor.

According to inventive concepts, as the first part 120a of the oxide semiconductor layer 120 has a relatively small amount of oxygen vacancies, the transistor may improve in swing characteristics. In addition, the oxide semiconductor layer 120 may include the second parts 120b on which the contact electrodes 150 are disposed, and the second parts 120b may each have a relatively large oxygen vacancy. Therefore, the contact electrodes 150 may decrease in resistance/contact resistance. Accordingly, it may be possible to provide an oxide semiconductor channel transistor with increased electrical properties.

FIGS. 2 to 6 illustrate cross-sectional views showing a method of fabricating a semiconductor device according to some example embodiments of inventive concepts. For brevity of description, omission will be made to avoid repetitive discussion of the semiconductor device explained with reference to FIG. 1.

Figure 2:
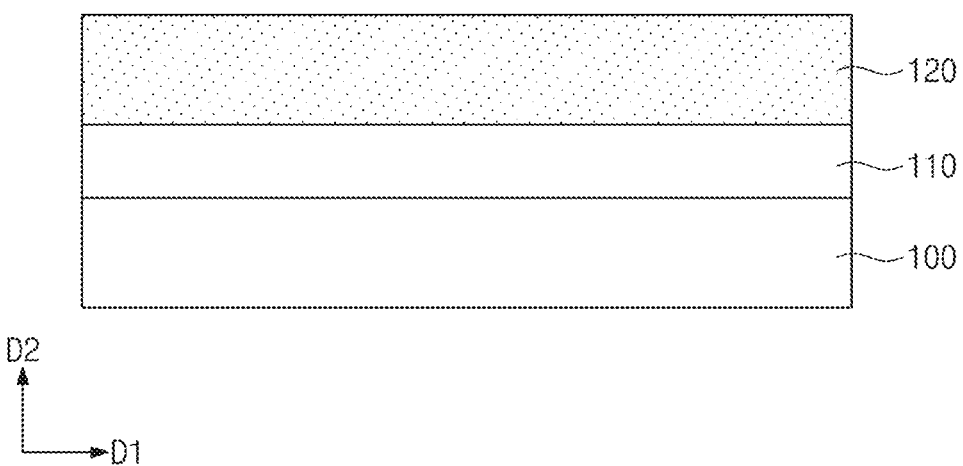
FIGS. 2 to 6 illustrate cross-sectional views showing a method of fabricating a semiconductor device according to some example embodiments of inventive concepts.

Referring to FIG. 2, an oxygen supply layer 110 and an oxide semiconductor layer 120 may be sequentially formed on a substrate 100. The oxygen supply layer 110 may include an oxygen-containing dielectric material. The oxygen supply layer 110 and the oxide semiconductor layer 120 may be formed concurrently or independently by various methods, such as by using at least one selected from physical vapor deposition (PVD), thermal chemical deposition process (thermal CVD), low pressure chemical vapor deposition (LPCVD), plasma enhanced chemical vapor deposition (PECVD), and atomic layer deposition (ALD).

Figure 3:
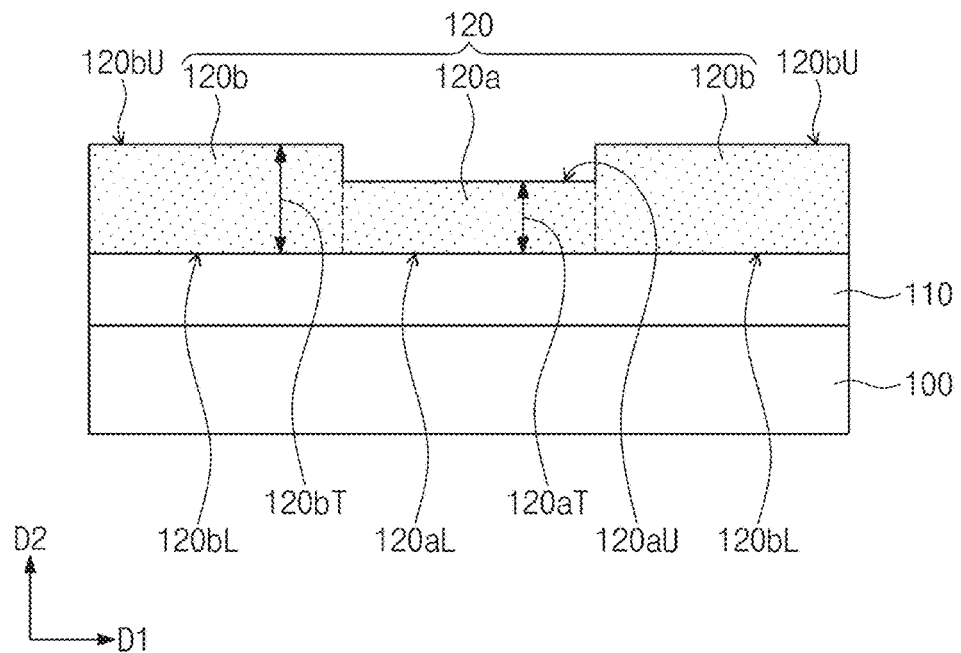

Referring to FIG. 3, an upper portion of the oxide semiconductor layer 120 may be patterned/removed. The upper portion of the oxide semiconductor layer 120 may be patterned by using, for example, dry etching and/or wet etching. As the upper portion of the oxide semiconductor layer 120 is patterned, the oxide semiconductor layer 120 may include a first part 120a and second parts 120b. The first part 120a may be interposed between the second parts 120b.

The first part 120a of the oxide semiconductor layer 120 may have a first thickness 120aT less than a second thickness 120bT of each of the second parts 120b of the oxide semiconductor layer 120. The first part 120a may have a top surface 120aU at a height lower than that of a top surface 120bU of each of the second parts 120b. The first part 120a may have a bottom surface 120aL at a height substantially the same as that of a bottom surface 120bL of each of the second parts 120b.

Figure 4:
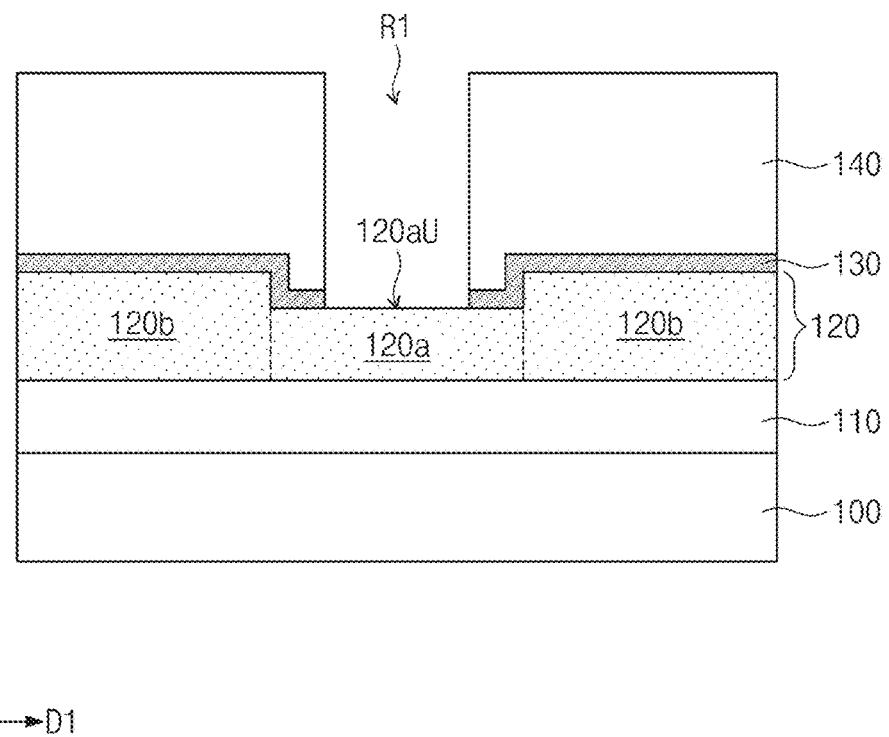

Referring to FIG. 4, a first contact pad 130 and an interlayer dielectric layer 140 may be sequentially formed on the oxide semiconductor layer 120. The first contact pad 130 and the interlayer dielectric layer 140 may independently or concurrently be formed by using, for example, at least one selected from physical vapor deposition (PVD), thermal chemical deposition process (thermal CVD), low pressure chemical vapor deposition (LPCVD), plasma enhanced chemical vapor deposition (PECVD), and atomic layer deposition (ALD).

A first empty region R1/hole region may be formed in the interlayer dielectric layer 140. The first empty region R1 may penetrate the interlayer dielectric layer 140 and the first contact pad 130, and may expose the top surface 120aU of the first part 120a of the oxide semiconductor layer 120.

Figure 5:
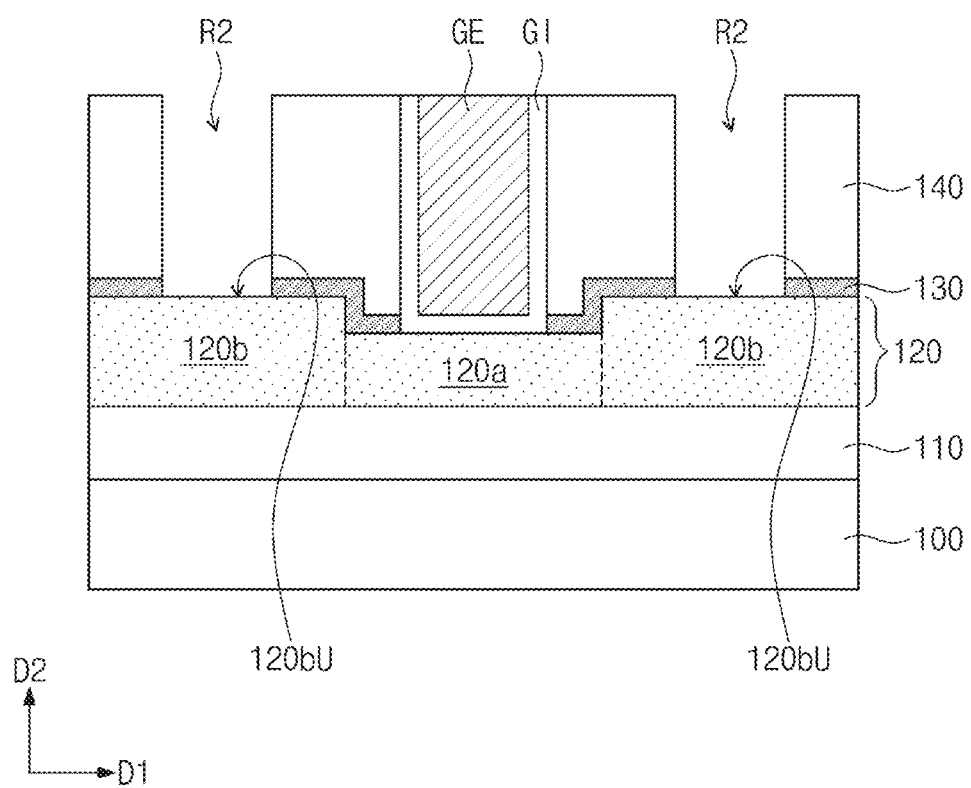

Referring to FIG. 5, a gate electrode GE and a gate dielectric pattern GI may be formed in/within the first empty region R1. The formation of the gate electrode GE and the gate dielectric pattern GI may include, for example, forming on the interlayer dielectric layer 140 a gate dielectric layer that fills a portion of the first empty region R1 with a process such as at least one of an ALD process or a thermal oxidation process, forming on the gate dielectric layer a gate electrode layer that fills an unoccupied portion of the first empty region R1 with a process such as at least one of a PVD process or a CVD process, and planarizing the gate electrode layer and the gate dielectric layer until a top surface of the interlayer dielectric layer 140 is exposed with a process such as at least one of a chemical-mechanical planarization (CMP) process or an etch-back process.

Second empty regions R2 may be formed in the interlayer dielectric layer 140, and may be spaced apart from each other across the gate electrode GE and the gate dielectric pattern GI. The gate electrode GE and the gate dielectric pattern GI may be disposed between the second empty regions R2. Each of the second empty regions R2 may penetrate the interlayer dielectric layer 140 and the first contact pad 130, and may expose the top surface 120bU of each of the second parts 120b of the oxide semiconductor layer 120.

Figure 6:
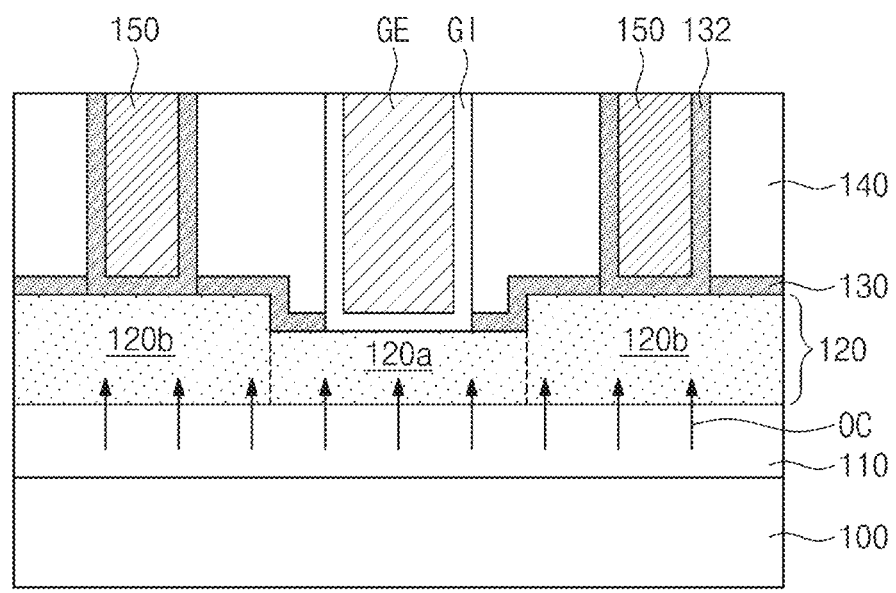

Referring to FIG. 6, second contact pads 132 and contact electrodes 150 may be formed in the second empty regions R2. The second contact pads 132 may be correspondingly formed in the second empty regions R2. The second contact pads 132 may be formed to fill portions of the second empty regions R2. The contact electrodes 150 may be correspondingly formed in the second empty regions R2. The contact electrodes 150 may be formed to fill unoccupied/hole portions of the second empty regions R2. The formation of the second contact pads 132 and the contact electrodes 150 may include, for example, forming on the interlayer dielectric layer 140 a contact pad layer that fills a portion of each of the second empty regions R2, forming on the contact pad layer a contact layer that fills an unoccupied portion of each of the second empty regions R2, and planarizing the contact pad layer and the contact layer until the top surface of the interlayer dielectric layer 140 is exposed.

An oxygen supply process OC may be performed on the substrate 100. The oxygen supply process OC may be, for example, a high-temperature annealing such as a high-temperature laser annealing and/or hot-plate annealing process. The oxygen supply process OC may cause oxygen in the oxygen supply layer 110 to diffuse into the oxide semiconductor layer 120, which may fill oxygen vacancies in the oxide semiconductor layer 120.

Referring to FIGS. 1 and 6, the second thickness 120bT of each of the second parts 120b of the oxide semiconductor layer 120 may be greater than the first thickness 120aT of the first part 120a of the oxide semiconductor layer 120. Therefore, during the oxygen supply process OC, oxygen in the oxygen supply layer 110 may diffuse into the first part 120a of the oxide semiconductor layer 120 and into a lower portion 120b2 of each of the second parts 120b of the oxide semiconductor layer 120, but may not diffuse or may diffuse less into an upper portion 120b1 of each of the second parts 120b of the oxide semiconductor layer 120. The oxygen diffused from the oxygen supply layer 110 may fill oxygen vacancies in the first part 120a of the oxide semiconductor layer 120 and oxygen vacancies in the lower portion 120b2 of each of the second parts 120b of the oxide semiconductor layer 120, but may not fill or may only partially fill oxygen vacancies in the upper portion 120b1 of each of the second parts 120b of the oxide semiconductor layer 120. As a result, the concentration of oxygen vacancies in the upper portion 120b1 of each of the second parts 120b may be greater than the concentration of oxygen vacancies in the first part 120a and greater than the concentration of oxygen vacancies in the lower portion 120b2 of each of the second parts 120b. The concentration of oxygen vacancies in the first part 120a of the oxide semiconductor layer 120 may be less than the concentration of oxygen vacancies in each of the second parts 120b of the oxide semiconductor layer 120.

According to inventive concepts, the oxide semiconductor layer 120 may be formed such that the first part 120a may have a thickness less than those of the second parts 120b. A process condition (e.g., process time and/or temperature) of the oxygen supply process OC may be adjusted to control the diffusion of oxygen contained in the oxygen supply layer 110, and thus the diffused oxygen may be adjusted to fill or fill more of the oxygen vacancies in the first part 120a of the oxide semiconductor layer 120 and oxygen vacancies in the lower portion 120b2 of each of the second parts 120b of the oxide semiconductor layer 120 and not to fill or to fill less of the oxygen vacancies in the upper portion 120b1 of each of the second parts 120b of the oxide semiconductor layer 120. Therefore, the number of or occurrence of or concentration of oxygen vacancies in the first part 120a of the oxide semiconductor layer 120 may be easily adjusted to be less than the number of or occurrence of or concentration of oxygen vacancies in each of the second parts 120b of the oxide semiconductor layer 120, and accordingly it may be possible to more effortlessly improve electrical properties of an oxide semiconductor channel transistor including the oxide semiconductor layer 120.

Figure 7:
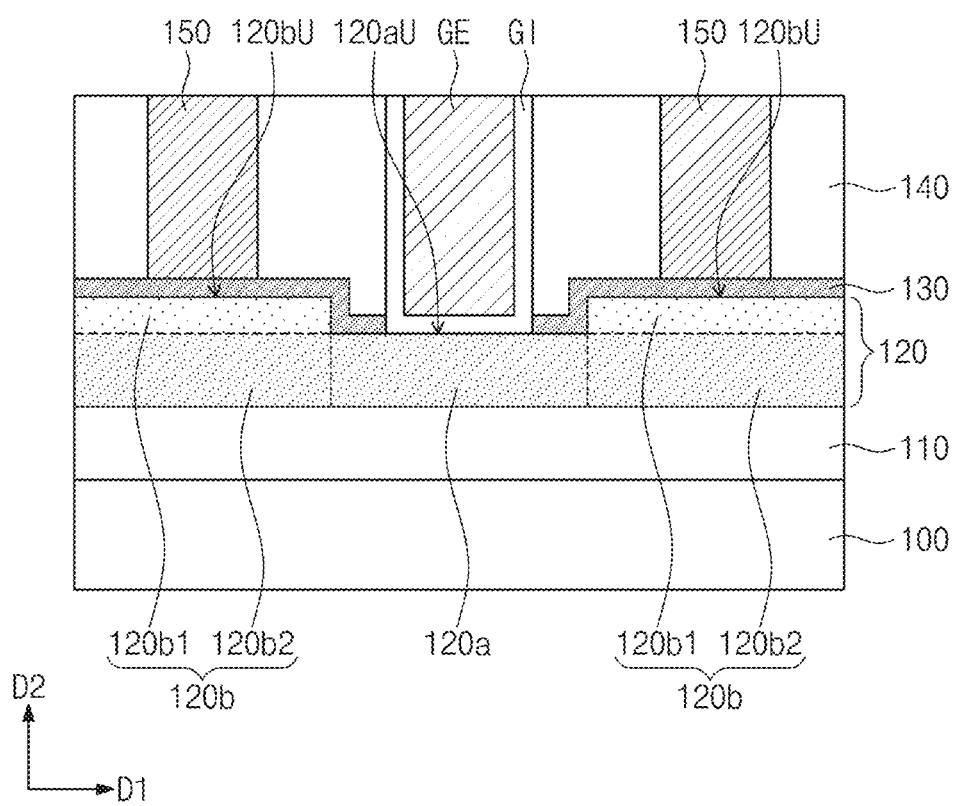
FIG. 7 illustrates a cross-sectional view showing a semiconductor device according to some example embodiments of inventive concepts.

FIG. 7 illustrates a cross-sectional view showing a semiconductor device according to some example embodiments of inventive concepts. For brevity of description, the following will focus on differences from the semiconductor device discussed with reference to FIG. 1.

Referring to FIG. 7, the first contact pads 130 may be correspondingly disposed on the top surfaces 120bU of the second parts 120b of the oxide semiconductor layer 120. The first contact pads 130 may be correspondingly interposed between the contact electrodes 150 and the top surfaces 120bU of the second parts 120b of the oxide semiconductor layer 120. The second contact pads 132 discussed with reference to FIG. 1 may be omitted in some example embodiments. The first contact pads 130 may extend onto the top surface 120aU of the first part 120a of the oxide semiconductor layer 120, and may contact the gate dielectric pattern GI.

The interlayer dielectric layer 140 may be disposed on the oxide semiconductor layer 120, and may cover the gate electrode GE and the contact electrodes 150. According to some example embodiments, the interlayer dielectric layer 140 may be in direct contact with lateral surfaces of each of the contact electrodes 150. Except the difference mentioned above, a semiconductor device according to the various embodiments is substantially the same as the semiconductor device discussed with reference to FIG. 1.

Figure 8:
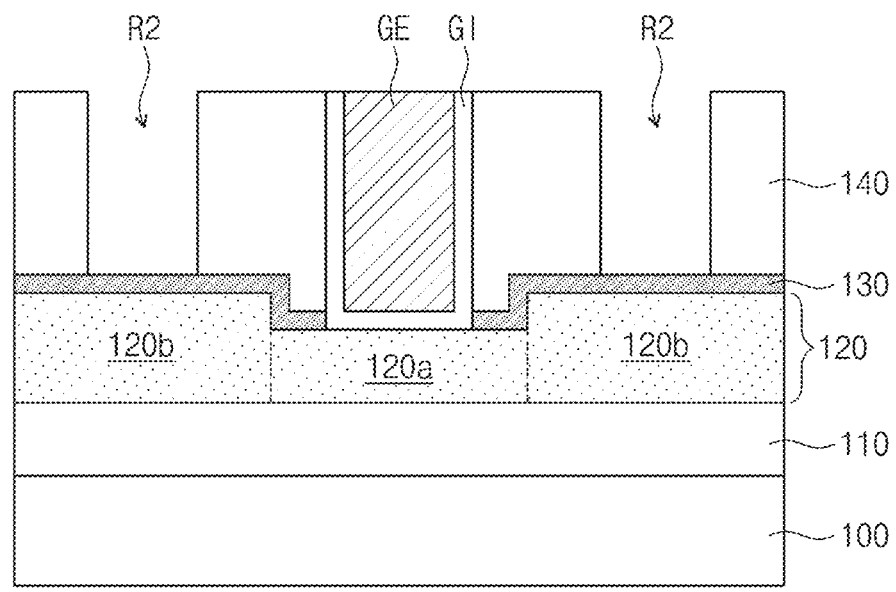
FIG. 8 illustrates a cross-sectional view showing a method of fabricating a semiconductor device according to some example embodiments of inventive concepts.
Figure 8:
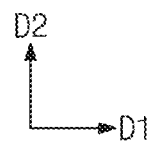

FIG. 8 illustrates a cross-sectional view showing a method of fabricating a semiconductor device according to some example embodiments of inventive concepts. For brevity of description, the following will focus on differences from the semiconductor device discussed with reference to FIGS. 2 to 6.

Referring to FIG. 8, the second empty regions R2 may be formed in the interlayer dielectric layer 140, and may be spaced apart from each other across the gate electrode GE and the gate dielectric pattern GI. According to some example embodiments, the second empty regions R2 may penetrate the interlayer dielectric layer 140 and may correspondingly expose top surfaces of the first contact pads 130.

Afterwards, as discussed with reference to FIG. 6, the contact electrodes 150 may be correspondingly formed in the second empty regions R2. According to some example embodiments, the formation of the second contact pads 132 may be omitted. The formation of the contact electrodes 150 may include, for example, forming on the interlayer dielectric layer 140 a contact layer that fills the second empty regions R2, and planarizing the contact layer until a top surface of the interlayer dielectric layer 140 is exposed. Except the difference discussed above, a method of fabricating a semiconductor device according to the present embodiment is substantially the same as that discussed with reference to FIGS. 2 to 6.

Figure 9:
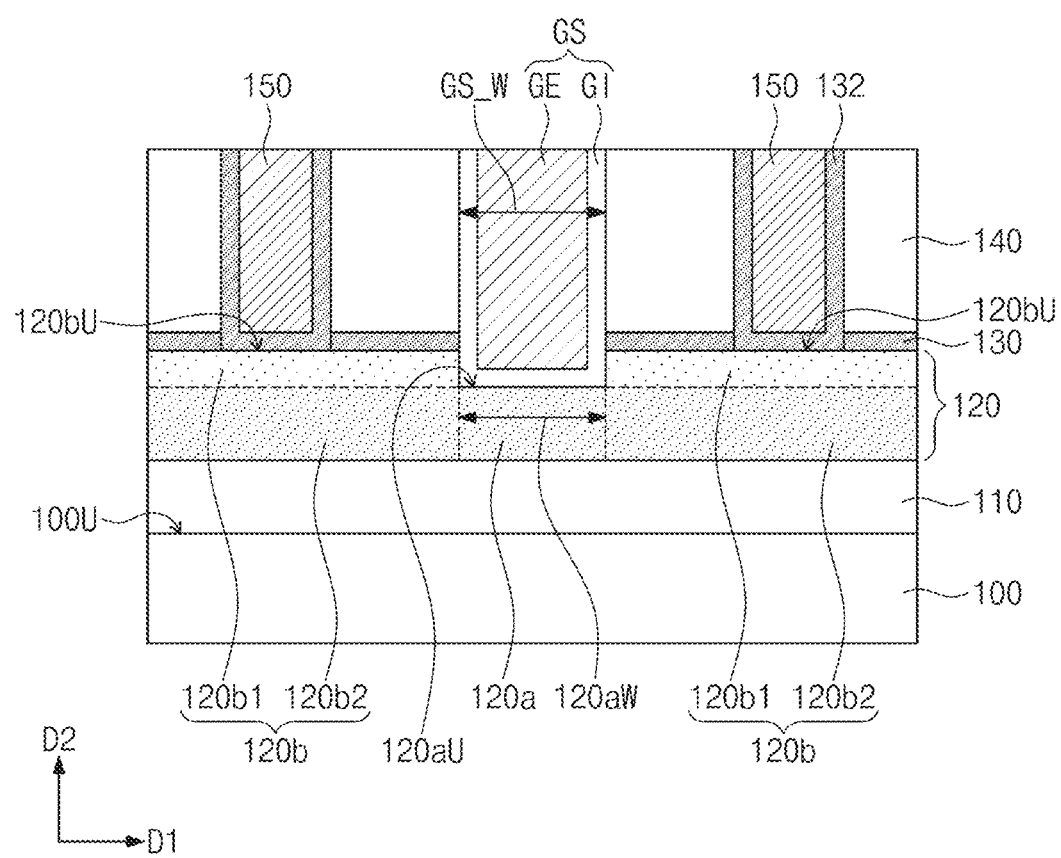
FIG. 9 illustrates a cross-sectional view showing a semiconductor device according to some example embodiments of inventive concepts.

FIG. 9 illustrates a cross-sectional view showing a semiconductor device according to some example embodiments of inventive concepts. For brevity of description, the following will focus on differences from the semiconductor device discussed with reference to FIG. 1.

Referring to FIG. 9, the gate electrode GE and the gate dielectric pattern GI may constitute a gate structure GS. The gate structure GS and the oxide semiconductor layer 120 may have a width in the first direction D1 parallel to the top surface 100U of the substrate 100. According to some example embodiments, the first part 120a of the oxide semiconductor layer 120 may have a width 120aW (e.g. a width in the channel length direction) substantially the same as a width GS_W (e.g. the width in the channel length direction) of the gate structure GS. The second parts 120b of the oxide semiconductor layer 120 may be in contact with the gate dielectric pattern GI. For example, the upper portion 120b1 of each of the second parts 120b of the oxide semiconductor layer 120 may be in contact with the gate dielectric pattern GI.

The first contact pads 130 may be correspondingly disposed on the top surfaces 120bU of the second parts 120b of the oxide semiconductor layer 120, and may be in contact with the gate dielectric pattern GI. Except the difference mentioned above, a semiconductor device according to the present embodiment is substantially the same as the semiconductor device discussed with reference to FIG. 1.

Figure 10:
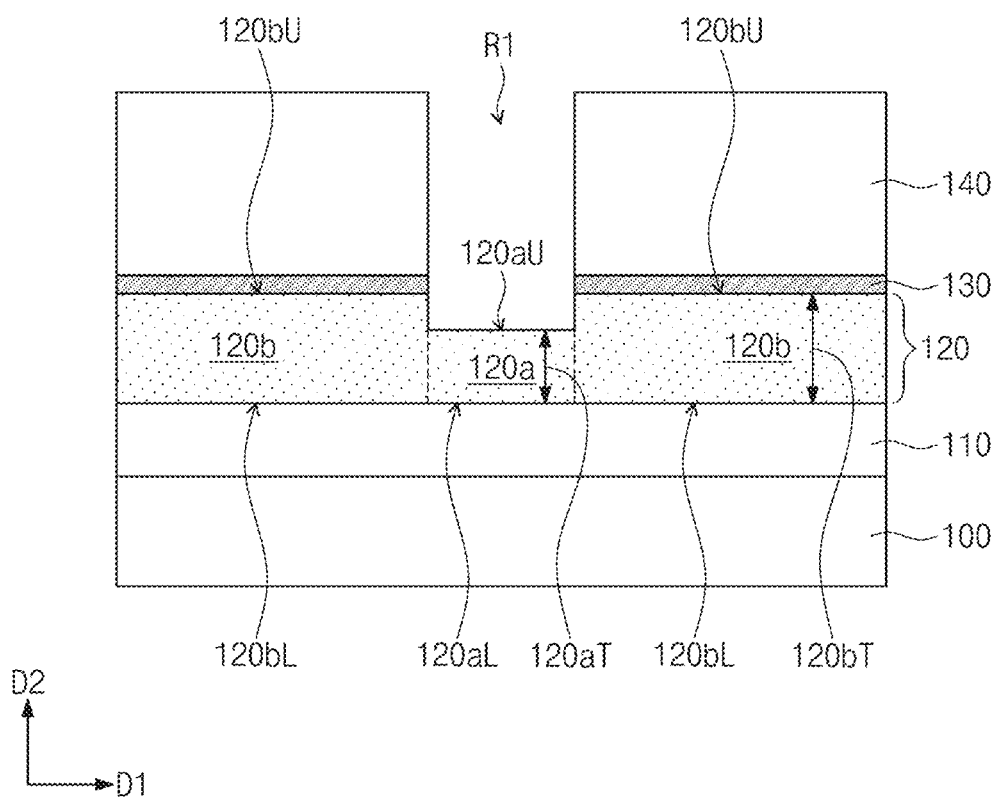
FIGS. 10 to 12 illustrate cross-sectional views showing a method of fabricating a semiconductor device according to some example embodiments of inventive concepts.
Figure 11:
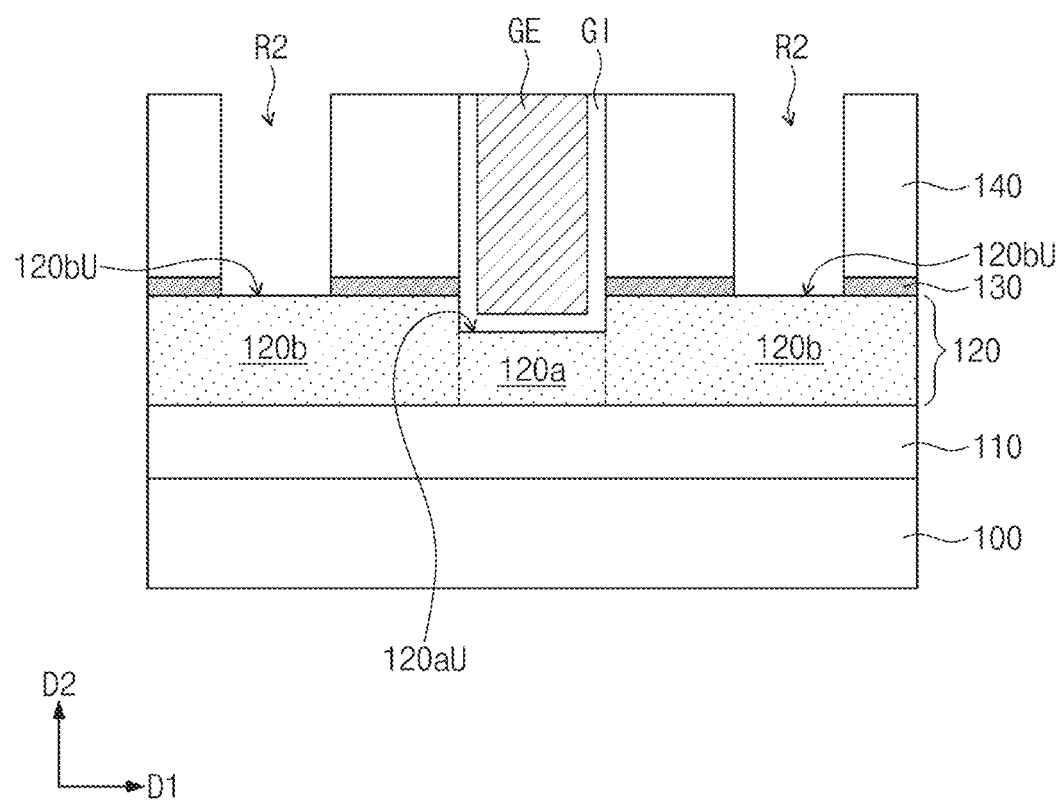
Figure 12:
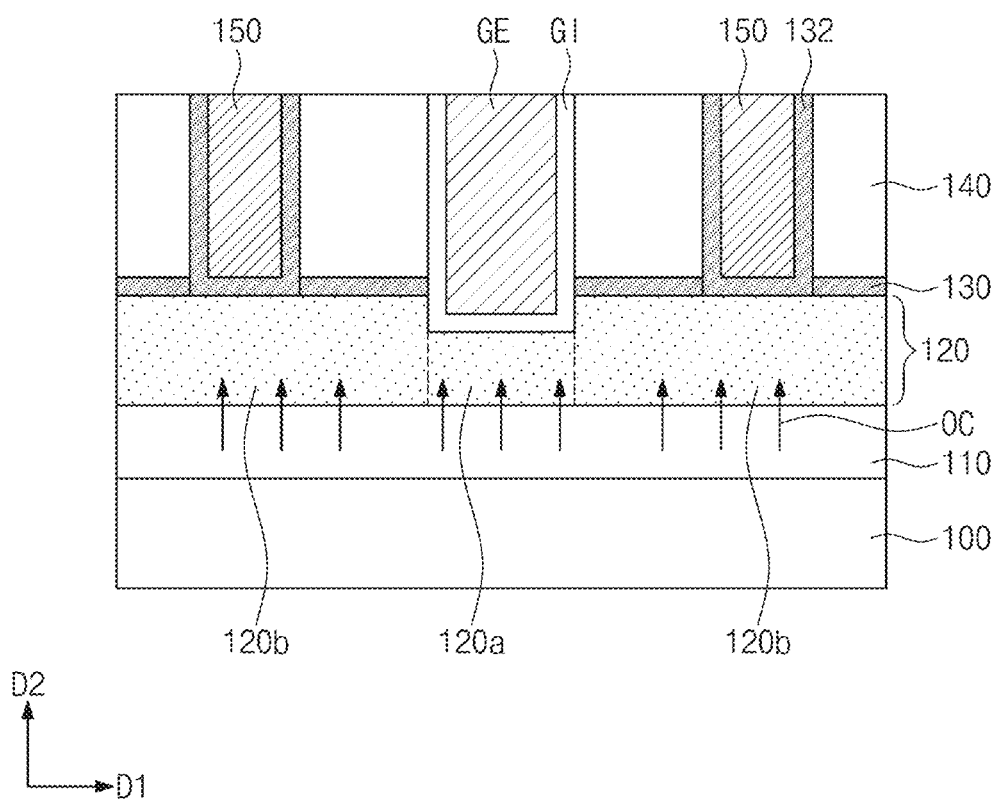

FIGS. 10 to 12 illustrate cross-sectional views showing a method of fabricating a semiconductor device according to some example embodiments of inventive concepts. For brevity of description, the following will focus on differences from the semiconductor device discussed with reference to FIGS. 2 to 6.

Referring to FIG. 10, the oxygen supply layer 110, the oxide semiconductor layer 120, the first contact pad 130, and the interlayer dielectric layer 140 may be sequentially formed on the substrate 100.

The first empty region R1 may be formed in the interlayer dielectric layer 140. The first empty region R1 may penetrate the interlayer dielectric layer 140 and the first contact pad 130 and may also penetrate an upper portion of the oxide semiconductor layer 120. The upper portion of the oxide semiconductor layer 120 may be over-etched and patterned by an etching process (e.g., dry etching process and/or wet etching process) for forming the first empty region R1. As the upper portion of the oxide semiconductor layer 120 is patterned, the oxide semiconductor layer 120 may include the first part 120a and the second parts 120b. The first part 120a of the oxide semiconductor layer 120 may have a first thickness 120aT less than a second thickness 120bT of each of the second parts 120b of the oxide semiconductor layer 120. The top surface 120aU of the first part 120a may be located at a height lower than that of the top surface 120bU of each of the second parts 120b. The first empty region R1 may expose the top surface 120aU of the first part 120a. The bottom surface 120aL of the first part 120a may be located at a height substantially the same as that of the bottom surface 120bL of each of the second parts 120b.

Referring to FIG. 11, the gate electrode GE and the gate dielectric pattern GI may be formed in the first empty region R1. The gate electrode GE may be disposed on the top surface 120aU of the first part 120a of the oxide semiconductor layer 120, and the gate dielectric pattern GI may be interposed between the gate electrode GE and the top surface 120aU of the first part 120a of the oxide semiconductor layer 120. The gate dielectric pattern GI may be in contact with the top surface 120aU of the first part 120a of the oxide semiconductor layer 120.

The second empty regions R2 may be formed in the interlayer dielectric layer 140, and may be spaced apart from each other across the gate electrode GE and the gate dielectric pattern GI. Each of the second empty regions R2 may penetrate the interlayer dielectric layer 140 and the first contact pad 130, and may expose the top surface 120bU of each of the second parts 120b of the oxide semiconductor layer 120.

Referring to FIG. 12, the second contact pads 132 and the contact electrodes 150 may be formed in the second empty regions R2. The oxygen supply process OC may be performed on the substrate 100. The oxygen supply process OC may cause oxygen in the oxygen supply layer 110 to diffuse into the oxide semiconductor layer 120 to at least partially fill oxygen vacancies in the oxide semiconductor layer 120.

Except the difference mentioned above, a method of fabricating a semiconductor device according to the present embodiment is substantially the same as that discussed with reference to FIGS. 2 to 6.

Figure 13:
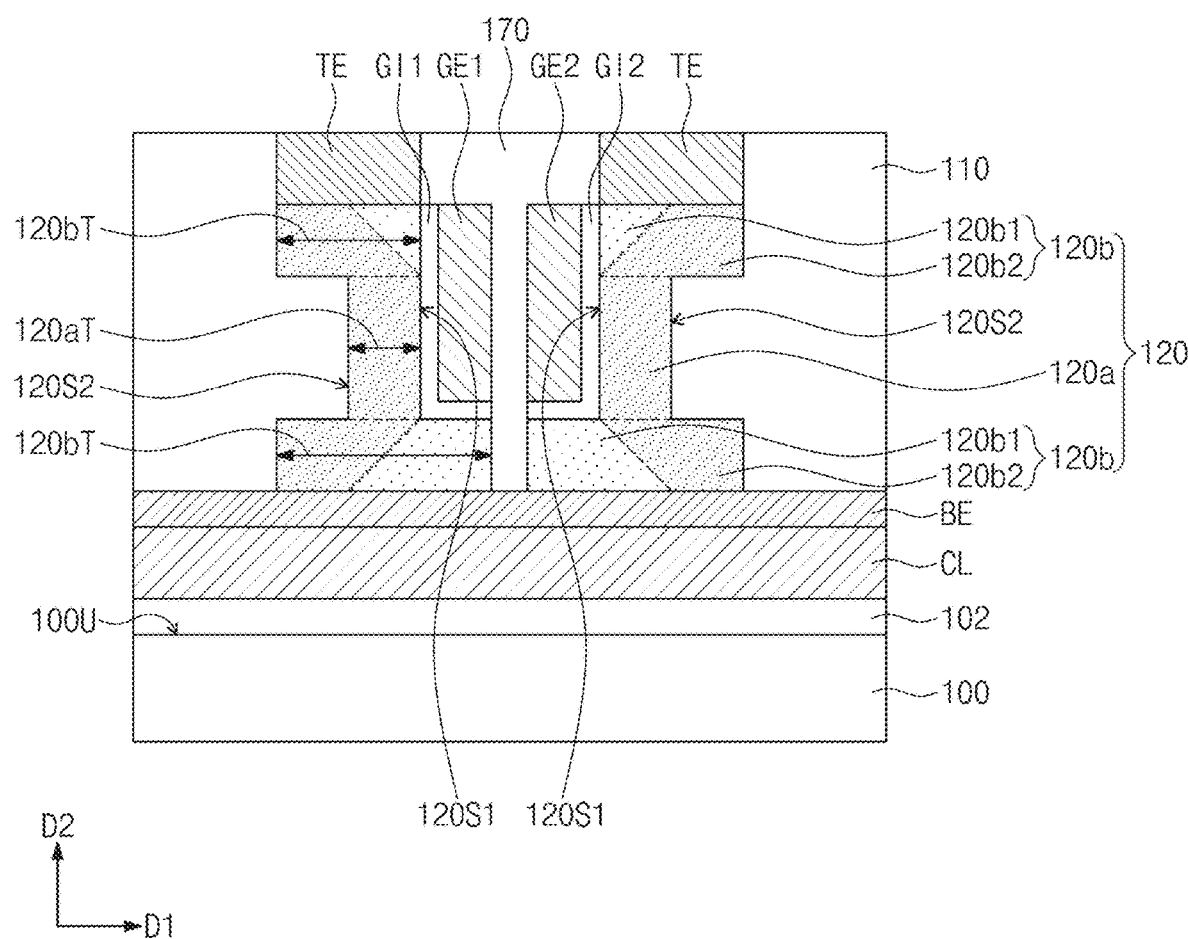
FIG. 13 illustrates a cross-sectional view showing a semiconductor device according to some example embodiments of inventive concepts.

FIG. 13 illustrates a cross-sectional view showing a semiconductor device according to some example embodiments of inventive concepts.

Referring to FIG. 13, a lower dielectric layer 102 may be disposed on a substrate 100. The substrate 100 may be or may include a semiconductor substrate, for example, a silicon (Si) substrate, a germanium (Ge) substrate, a silicon-germanium (SiGe) substrate, or a silicon-on-insulator (SOI) substrate. The lower dielectric layer 102 may include, for example, one or more of silicon oxide, silicon nitride, and silicon oxynitride.

A conductive line CL and a lower electrode BE may be sequentially disposed on the lower dielectric layer 102. The conductive line CL may be disposed between the lower dielectric layer 102 and the lower electrode BE. The conductive line CL may extend along a first direction D1 parallel to a top surface 100U of the substrate 100, and the lower electrode BE may extend in the first direction D1 along a top surface of the conductive line CL. The conductive line CL and the lower electrode BE may each include doped polysilicon, metal, conductive metal nitride, conductive metal silicide, conductive metal oxide, or any combination thereof. The conductive line CL and the lower electrode BE may each independently or concurrently include, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. The conductive line CL and the lower electrode BE may each independently or concurrently include a two-dimensional semiconductor material, such as graphene, carbon nano-tube, or any combination thereof.

A pair of oxide semiconductor layers 120 may be disposed on the lower electrode BE and may be spaced apart from each other in the first direction D1. The pair of oxide semiconductor layers 120 may extend in a second direction D2 perpendicular to the top surface 100U of the substrate 100. The pair of oxide semiconductor layers 120 may include, for example, InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, or any combination thereof. For example, the pair of oxide semiconductor layers 120 may include indium gallium zinc oxide (IGZO). The pair of oxide semiconductor layers 120 may be a single or multiple layer including amorphous, crystalline, and/or polycrystalline oxide semiconductor. The pair of oxide semiconductor layers 120 may each have a bandgap energy greater than that of silicon. The pair of oxide semiconductor layers 120 may have a bandgap energy ranging from about 1.5 eV to about 5.6 eV, for example, from about 2.0 eV to about 4.0 eV.

A pair of gate electrodes GE1 and GE2 and a pair of gate dielectric patterns GI1 and GI2 may be disposed between the pair of oxide semiconductor layers 120. The pair of gate electrodes GE1 and GE2 may include a first gate electrode GE1 on one of the pair of oxide semiconductor layers 120 and a second gate electrode GE2 on the other of the pair of oxide semiconductor layers 120. The first gate electrode GE1 and the second gate electrode GE2 may be spaced apart from each other in the first direction D1 between the pair of oxide semiconductor layers 120. The pair of gate dielectric patterns GI1 and GI2 may include a first gate dielectric pattern GI1 between the first gate electrode GE1 and one of the pair of oxide semiconductor layers 120, and may also include a second gate dielectric pattern GI2 between the second gate electrode GE2 and the other of the pair of oxide semiconductor layers 120. The first gate dielectric pattern GI1 and the second gate dielectric pattern GI2 may be spaced apart from each other in the first direction D1 between the pair of oxide semiconductor layers 120. The first and second gate electrodes GE1 and GE2 may be disposed between the first gate dielectric pattern GI1 and the second gate dielectric pattern GI2.

The first and second gate electrodes GE1 and GE2 may independently or concurrently include doped polysilicon, metal, conductive metal nitride, conductive metal silicide, conductive metal oxide, or any combination thereof. The first and second gate electrodes GE1 and GE2 may include, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. According to some example embodiments, the first and second gate electrodes GE1 and GE2 may include a two-dimensional semiconductor material, such as graphene, carbon nano-tube, or any combination thereof. The first and second gate dielectric patterns GI1 and GI2 may include silicon oxide, silicon oxynitride, high-k dielectric whose dielectric constant is greater than that of silicon, or any combination thereof. The high-k dielectric may include metal oxide and/or metal oxynitride. The high-k dielectric may include, for example, $HfO_2$, HfSiO, HfSiON, HfTaO, HfTiO, HfZrO, $ZrO_2$, $Al_2O_3$, or any combination thereof.

The pair of oxide semiconductor layers 120 may be correspondingly provided thereon with upper electrodes TE that are spaced apart from each other in the first direction D1. The upper electrodes TE may include doped polysilicon, metal, conductive metal nitride, conductive metal silicide, conductive metal oxide, or any combination thereof. The upper electrodes TE may include, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. The upper electrodes TE may include a two-dimensional semiconductor material, such as graphene, carbon nano-tube, or any combination thereof.

Each of the oxide semiconductor layers 120 may include a first part 120a and second parts 120b that are spaced apart from each other across the first part 120a. The second parts 120b may be spaced across the first part 120a from each other along the second direction D2 perpendicular to the top surface 100U of the substrate 100. The first part 120a may be interposed between the second parts 120b. The first part 120a may be a channel region of each of the oxide semiconductor layers 120, and the second parts 120b may be contact regions of each of the oxide semiconductor layers 120, one of which is adjacent to the lower electrode BE and other of which is adjacent to a corresponding one of the upper electrodes TE. The first part 120a may be a vertical part that extends in the second direction D2, and the second parts 120b may be horizontal parts that extend in the first direction D1. Each of the oxide semiconductor layers 120 may have a thickness in the first direction D1. The first part 120a may have a first thickness 120aT less than a second thickness 120bT of each of the second parts 120b. A difference between the first thickness 120aT and the second thickness 120bT may be, for example, equal to or less than about 10 nm.

Each of the oxide semiconductor layers 120 may have an inner surface 120S1 and an outer surface 120S2 that are opposite to each other in the first direction D1. The inner surfaces 120S1 of the oxide semiconductor layers 120 may face each other, and the first and second gate electrodes GE1 and GE2 may be correspondingly disposed on the inner surfaces 120S1 of the oxide semiconductor layers 120. The first gate dielectric pattern GI1 may be interposed between the first gate electrode GE1 and the inner surface 120S1 of one of the oxide semiconductor layers 120, and the second gate dielectric pattern GI2 may be interposed between the second gate electrode GE2 and the inner surface 120S1 of other of the oxide semiconductor layers 120.

The second parts 120b of each of the oxide semiconductor layers 120 may protrude from the outer surface 120S2 of the first part 120a in the first direction D1 or in a direction reverse to the first direction D1. The outer surfaces 120S2 of the second parts 120b may be offset from the outer surface 120S2 of the first part 120a in the first direction D1 or in a direction reverse to the first direction D1. Among the second parts 120b of each of the oxide semiconductor layers 120, the inner surface 120S1 of the second part 120b adjacent to the corresponding upper electrode TE may be aligned along the second direction D2 with the inner surface 120S1 of the first part 120a. Among the second parts 120b of each of the oxide semiconductor layers 120, the second part 120b adjacent to the lower electrode BE may extend between the first gate electrode GE1 and the lower electrode BE or between the second gate electrode GE2 and the lower electrode BE. The inner surface 120S1 of the second part 120b adjacent to the lower electrode BE may be offset from the inner surface 120S1 of the first part 120a in the first direction D1 or in a direction reverse to the first direction D1. The first gate dielectric pattern GI1 may extend between the first gate electrode GE1 and the second part 120b, which is adjacent to the lower electrode BE, of one of the oxide semiconductor layers 120, and the second gate dielectric pattern GI2 may extend between the second gate electrode GE2 and the second part 120b, which is adjacent to the lower electrode BE, of other of the oxide semiconductor layers 120.

An oxygen supply layer 110 may be disposed on the outer surface 120S2 of each of the oxide semiconductor layers 120. A portion of the oxygen supply layer 110 may extend between the second parts 120b of each of the oxide semiconductor layers 120 and may cover the outer surface 120S2 of the first part 120a of each of the oxide semiconductor layers 120. The lower electrode BE may be provided thereon with the oxygen supply layer 110 that extends onto lateral surfaces of the upper electrodes TE. The oxygen supply layer 110 may include an oxygen-containing dielectric material, such as silicon oxide.

In each of the oxide semiconductor layers 120, a concentration of oxygen vacancies in the first part 120a may be less than that in each of the second parts 120b. Each of the second parts 120b may include an outer portion 120b2 adjacent to the oxygen supply layer 110 and an inner portion 120b1 distant from the oxygen supply layer 110. A concentration of oxygen vacancies in the outer portion 120b2 of each of the second parts 120b may be less than a concentration of oxygen vacancies in the inner portion 120b1 of each of the second parts 120b. The concentration of oxygen vacancies in the outer portion 120b2 of each of the second parts 120b may be substantially the same as a concentration of oxygen vacancies in the first part 120a, and the concentration of oxygen vacancies in the inner portion 120b1 of each of the second parts 120b may be greater than the concentration of oxygen vacancies in the first part 120a. For example, in each of the oxide semiconductor layers 120, the proportion of oxygen vacancies in the first part 120a may be equal to or less than about 5%, and the proportion of oxygen vacancies in the outer portion 120b2 of each of the second parts 120b may be equal to or less than about 5%. The proportion of oxygen vacancies in the inner portion 120b1 of each of the second parts 120b may be greater than about 5%.

A separation dielectric pattern 170 may be interposed between the upper electrodes TE, and may extend between the first and second gate electrodes GE1 and GE2 and between the first and second gate dielectric patterns GI1 and GI2. The separation dielectric pattern 170 may extend between the second parts 120*b*, which are adjacent to the lower electrode BE, of the oxide semiconductor layers 120 and may contact the lower electrode BE. The separation dielectric pattern 170 may include, for example, one or more of silicon oxide, silicon nitride, or silicon oxynitride.

A first oxide semiconductor channel transistor may be constituted by one of the oxide semiconductor layers 120, the first gate electrode GE1 on the one of the oxide semiconductor layers 120, a corresponding upper electrode TE connected to the one of the oxide semiconductor layers 120, and the lower electrode BE, and a second oxide semiconductor channel transistor may be constituted by other of the oxide semiconductor layers 120, the second gate electrode GE2 on the other of the oxide semiconductor layers 120, a corresponding upper electrode TE connected to the other of the oxide semiconductor layers 120, and the lower electrode BE. The first and second oxide semiconductor channel transistors may be or correspond to vertical channel transistors.

According to inventive concepts, as the first part 120*a* of each of the oxide semiconductor layers 120 has a relatively small oxygen vacancy, the first and second transistors may improve in swing characteristics. In addition, the second parts 120*b*, which are adjacent to the upper electrodes TE and the lower electrode BE, of each of the oxide semiconductor layers 120 may each have a relatively large oxygen vacancy. Therefore, the upper electrodes TE and the lower electrode BE may decrease in resistance/contact or sheet resistance. Accordingly, it may be possible to provide oxide semiconductor channel transistors with improved electrical properties.

Alternatively or additionally, vertical channel transistors may be constituted by/correspond to the oxide semiconductor layers 120, the first and second gate electrodes GE1 and GE2, the upper electrodes TE, and the lower electrode BE. Accordingly, it may be possible to provide oxide semiconductor channel transistors capable of easily achieving high integration.

FIGS. 14 to 18 illustrate cross-sectional views showing a method of fabricating a semiconductor device according to some example embodiments of inventive concepts. For brevity of description, omission will be made to avoid repetitive discussion of the semiconductor device explained with reference to FIG. 13.

Figure 14:
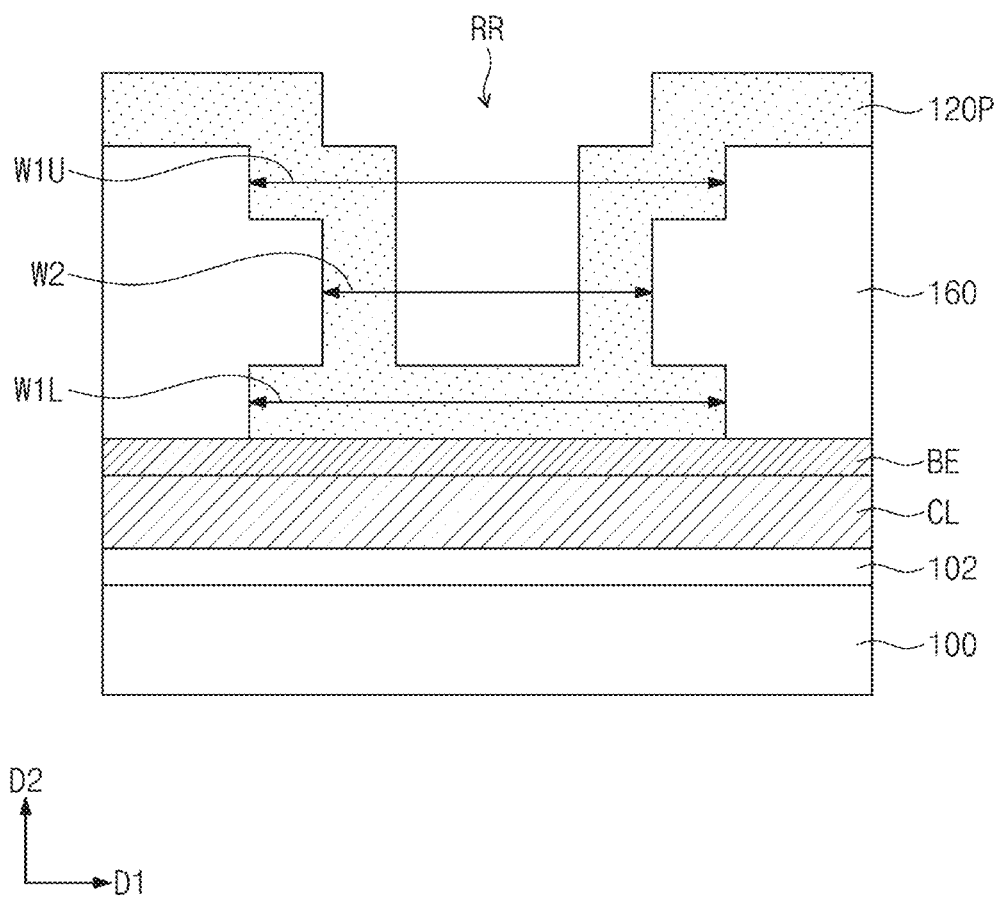
FIGS. 14 to 18 illustrate cross-sectional views showing a method of fabricating a semiconductor device according to some example embodiments of inventive concepts.

Referring to FIG. 14, a lower dielectric layer 102, a conductive line CL, and a lower electrode BE may be sequentially formed on a substrate 100. The formation of the conductive line CL and the lower electrode BE may include, for example, forming in the lower dielectric layer 102 a trench having a linear shape that extends in the first direction D1, sequentially depositing on the lower dielectric layer 102 a conductive layer and a lower electrode layer that fill the trench, and planarizing the lower electrode layer and the conductive layer until a top surface of the lower dielectric layer 102 is exposed.

A mold layer 160 may be formed on the lower electrode BE. The mold layer 160 may include a recess region RR that penetrates therethrough. The recess region RR may penetrate the mold layer 160 and may partially expose a top surface of the lower electrode BE. The recess region RR may have a width in the first direction D1. The recess region RR may have a width W1U at an upper portion thereof, a width W1L at a lower portion thereof, and a width W2 at an intermediate portion thereof, which widths W1U and W1L are greater than the width W2. The mold layer 160 may include, for example, one or more of silicon oxide, silicon nitride, silicon oxynitride, and silicon-on-hardmask (SOH) materials.

A preliminary oxide semiconductor layer 120P may be formed on the mold layer 160 and may fill a portion of the recess region RR. The preliminary oxide semiconductor layer 120P may have a substantially uniform thickness that covers an inner surface of the recess region RR and may fill the lower portion of the recess region RR. The preliminary oxide semiconductor layer 120P may cover the lower electrode BE exposed to the recess region RR.

Figure 15:
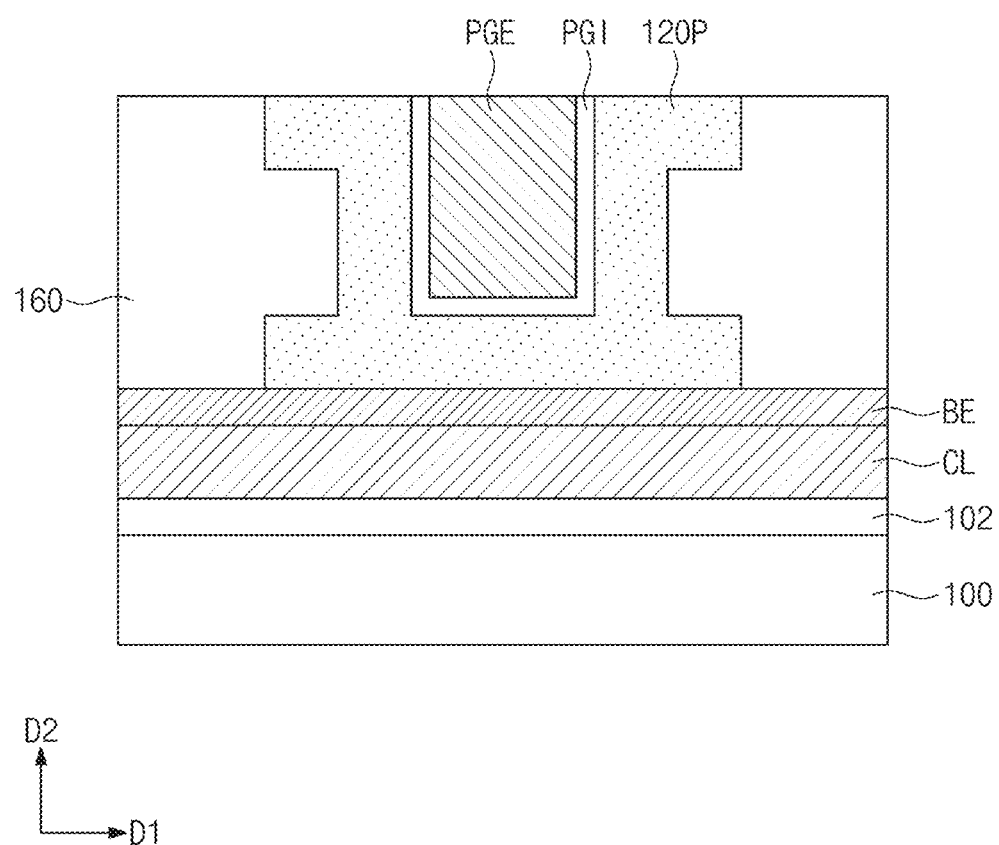

Referring to FIG. 15, a preliminary gate electrode PGE and a preliminary gate dielectric pattern POI may be formed to fill an unoccupied portion of the recess region RR. The formation of the preliminary gate electrode PGE and the preliminary gate dielectric pattern POI may include, for example, sequentially forming on the preliminary oxide semiconductor layer 120P a gate dielectric layer and a gate electrode layer that fill the unoccupied portion of the recess region RR, and planarizing the gate electrode layer, the gate dielectric layer, and the preliminary oxide semiconductor layer 120P until a top surface of the mold layer 160 is exposed. As the gate electrode layer, the gate dielectric layer, and the preliminary oxide semiconductor layer 120P are planarized, the preliminary gate electrode PGE, the preliminary gate dielectric pattern POI, and the preliminary oxide semiconductor layer 120P may be formed locally in the recess region RR.

Figure 16:
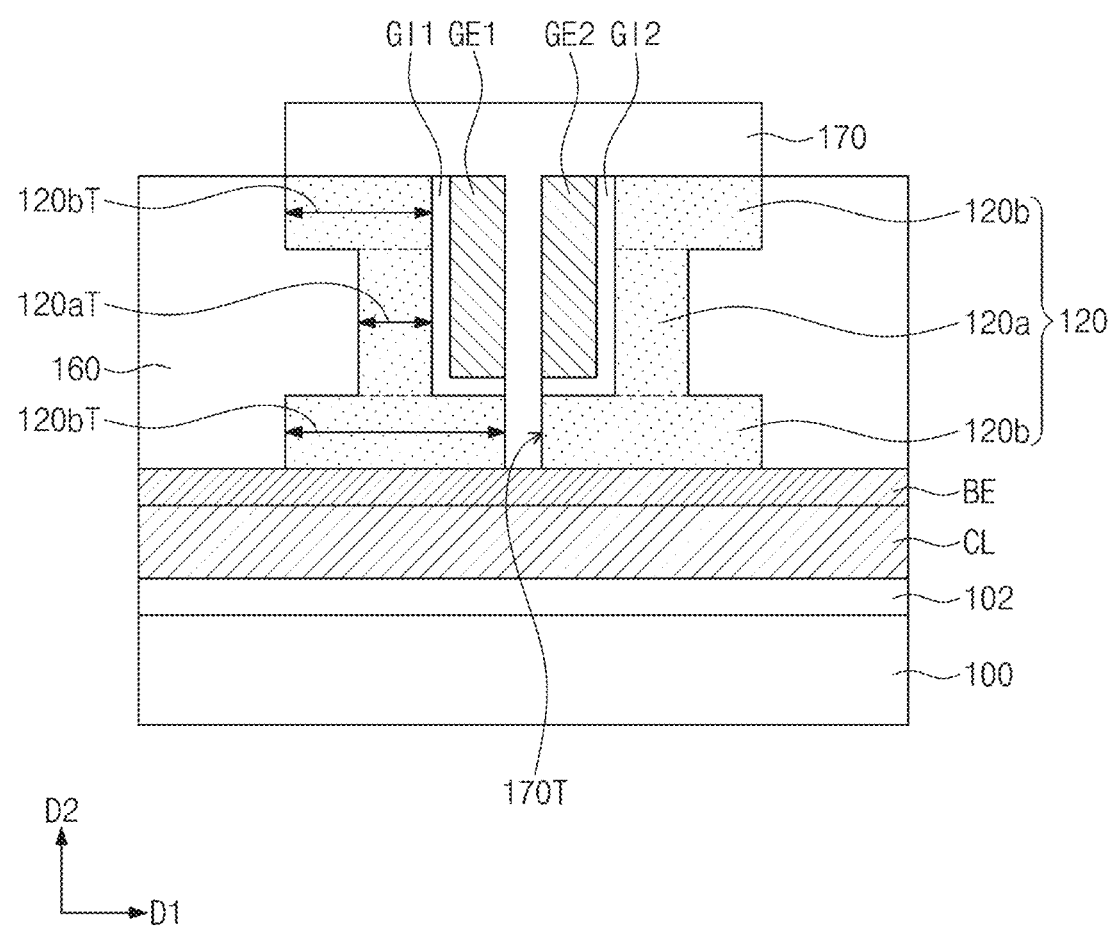

Referring to FIG. 16, a separation dielectric pattern 170 may be formed to penetrate the preliminary gate electrode PGE, the preliminary gate dielectric pattern POI, and the preliminary oxide semiconductor layer 120P. The separation dielectric pattern 170 may expose the top surface of the mold layer 160, and may cover uppermost surfaces of the preliminary gate electrode PGE, the preliminary gate dielectric pattern POI, and the preliminary oxide semiconductor layer 120P. The formation of the separation dielectric pattern 170 may include, for example, forming a separation trench 170T that penetrates the preliminary gate electrode PGE, the preliminary gate dielectric pattern PGI, and the preliminary oxide semiconductor layer 120P, forming on the mold layer 160 a separation dielectric layer that fills the separation trench 170T and covers the uppermost surfaces of the preliminary gate electrode PGE, the preliminary gate dielectric pattern PGI, and the preliminary oxide semiconductor layer 120P, and etching a portion of the separation dielectric layer until the top surface of the mold layer 160 is exposed.

The separation dielectric pattern 170 may separate the preliminary gate electrode PGE into a first gate electrode GE1 and a second gate electrode GE2 that are spaced apart from each other in the first direction D1, and the separation dielectric pattern 170 may separate the preliminary gate dielectric pattern PGI into a first gate dielectric pattern GI1 and a second gate dielectric pattern GI2 that are spaced apart from each other in the first direction D1. The separation dielectric pattern 170 may separate the preliminary oxide semiconductor layer 120P into a pair of oxide semiconductor layers 120 that are spaced apart from each other in the first direction D1.

Each of the oxide semiconductor layers 120 may include a first part 120*a* and second parts 120*b* that are spaced apart in the second direction D2 from each other across the first part 120*a*. The first part 120*a* may be interposed between the second parts 120*b*. The first part 120*a* may be a vertical part that extends in the second direction D2, and the second parts 120*b* may be horizontal parts that extend in the first direction D1. Each of the oxide semiconductor layers 120 may have a thickness in the first direction D1. The first part 120a may have a first thickness 120aT less than a second thickness 120bT of each of the second parts 120b.

Figure 17:
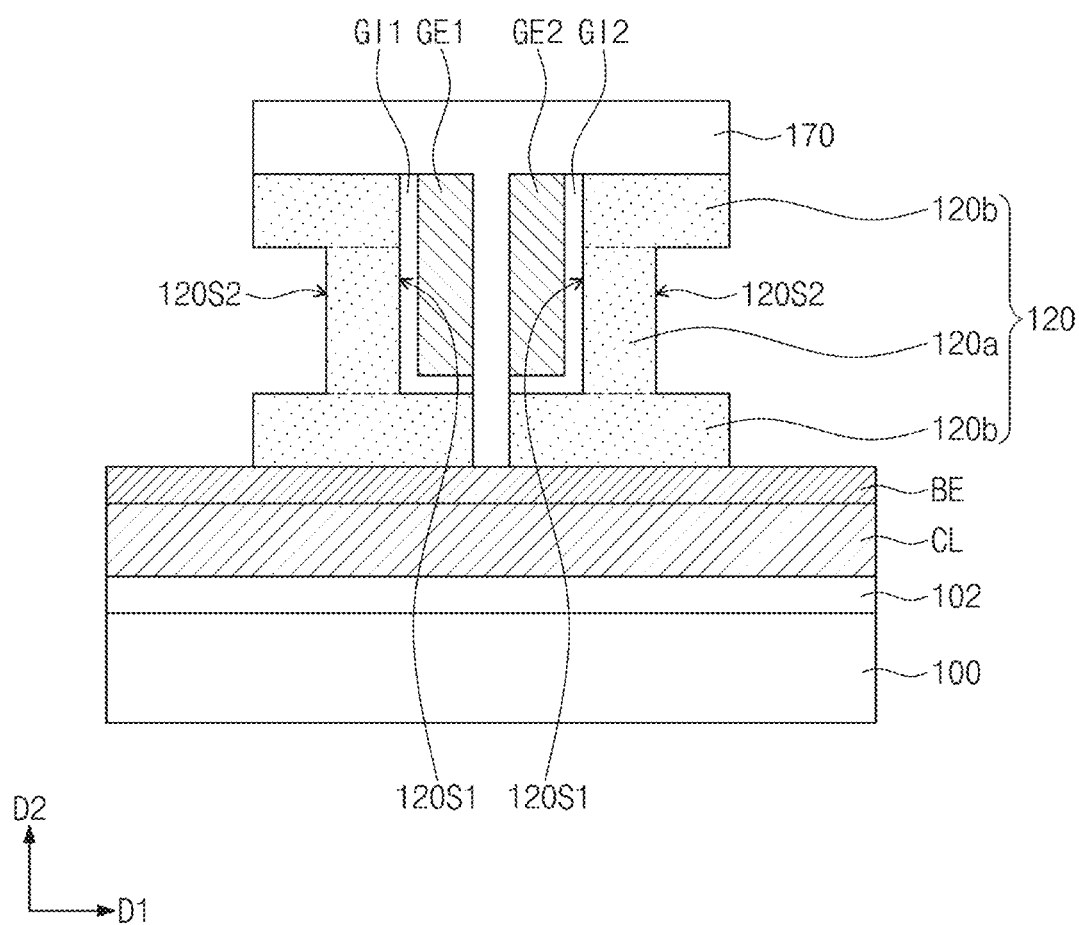

Referring to FIG. 17, the mold layer 160 may be removed. The removal of the mold layer 160 may include, for example, performing an etching process (e.g., wet etching process) that has an etch selectivity with respect to the separation dielectric pattern 170, the oxide semiconductor layer 120, and the lower electrode BE.

Each of the oxide semiconductor layers 120 may have an inner surface 120S1 and an outer surface 120S2 that are opposite to each other. The inner surfaces 120S1 of the oxide semiconductor layers 120 may face each other, and the first and second gate electrodes GE1 and GE2 may be correspondingly disposed on the inner surfaces 120S1 of the oxide semiconductor layers 120. The first gate dielectric pattern GI1 may be interposed between the first gate electrode GE1 and the inner surface 120S1 of one of the oxide semiconductor layers 120, and the second gate dielectric pattern GI2 may be interposed between the second gate electrode GE2 and the inner surface 120S1 of other of the oxide semiconductor layers 120. The removal of the mold layer 160 may expose the outer surfaces 120S2 of the oxide semiconductor layers 120.

Figure 18:
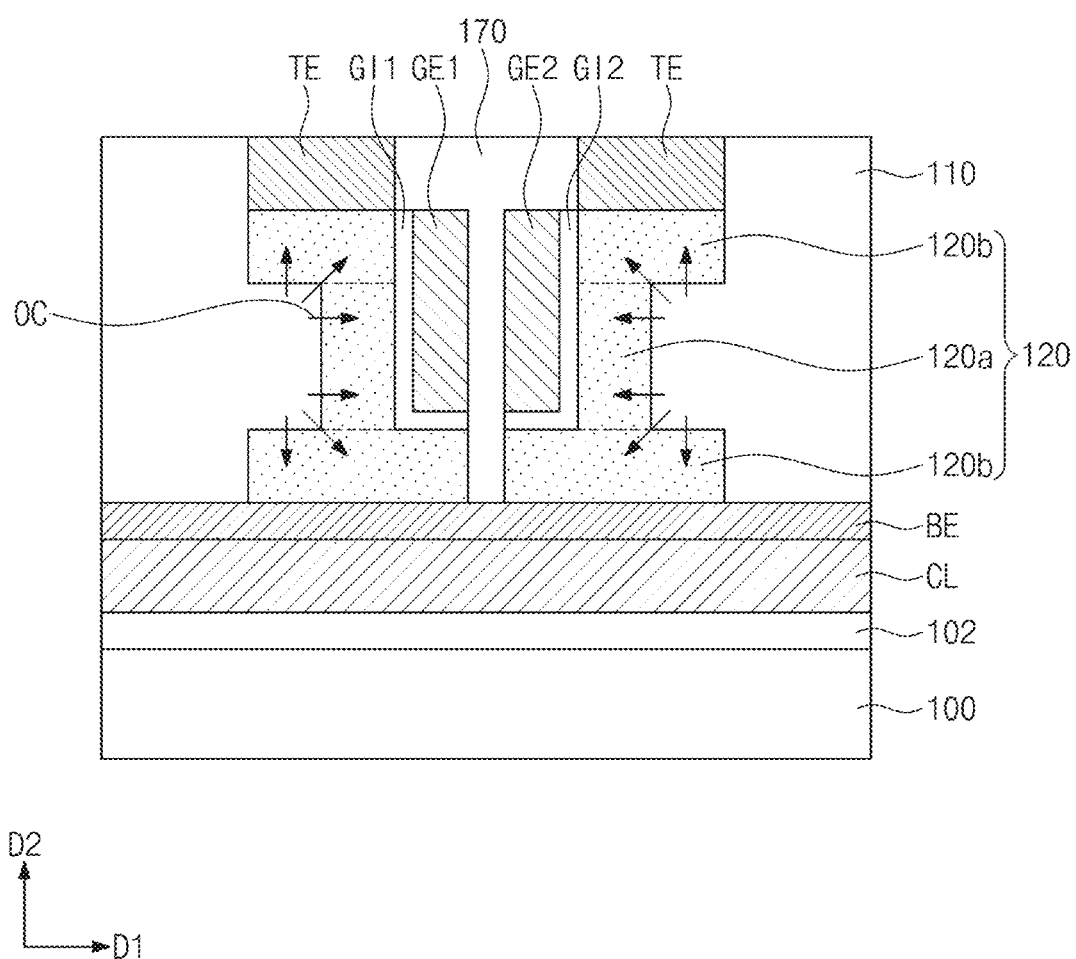

Referring to FIG. 18, an oxygen supply layer 110 may be formed to cover the outer surfaces 120S2 of the oxide semiconductor layers 120 and also to cover a portion of the top surface of the lower electrode BE. The formation of the oxygen supply layer 110 may include, for example, forming on the lower electrode BE an oxygen-containing layer that covers the separation dielectric pattern 170 and the outer surfaces 120S2 of the oxide semiconductor layers 120, and planarizing the oxygen-containing layer until a top surface of the separation dielectric pattern 170 is exposed.

Upper electrodes TE may be formed in an upper portion of the separation dielectric pattern 170. The upper electrodes TE may penetrate the upper portion of the separation dielectric pattern 170 and correspondingly connect with the oxide semiconductor layers 120. For example, the formation of the upper electrodes TE may include forming, in the upper portion of the separation dielectric pattern 170, holes that correspondingly expose top surfaces of the oxide semiconductor layers 120, forming on the separation dielectric pattern 170 an upper electrode layer that fills the holes, and planarizing the upper electrode layer until the top surface of the separation dielectric pattern 170 is exposed.

The lower electrode BE may be adjacent to one of the second parts 120b of each of the oxide semiconductor layers 120, and each of the upper electrodes TE may be adjacent to other of the second parts 120b of each of the oxide semiconductor layers 120.

An oxygen supply process OC may be performed on the substrate 100. The oxygen supply process OC may be, for example, a high-temperature annealing process. The oxygen supply process OC may cause that oxygen in the oxygen supply layer 110 may diffuse into the oxide semiconductor layers 120 to fill oxygen vacancies in the oxide semiconductor layers 120.

Referring to FIGS. 13 and 18, in each of the oxide semiconductor layers 120, the second thickness 120bT of each of the second parts 120b may be greater than the first thickness 120aT of the first part 120a. Therefore, during the oxygen supply process OC, oxygen in the oxygen supply layer 110 may diffuse into the first part 120a and the outer portion 120b2 of each of the second parts 120b, but may not diffuse into the inner portion 120b1 of each of the second parts 120b. The oxygen diffused from the oxygen supply layer 110 may fill oxygen vacancies in the first part 120a and oxygen vacancies in the outer portion 120b2 of each of the second parts 120b, but may not fill oxygen vacancies in the inner portion 120b1 of each of the second parts 120b. As a result, the proportion of oxygen vacancies in the inner portion 120b1 of each of the second parts 120b may be greater than the proportion of oxygen vacancies in the outer portion 120b2 of each of the second parts 120b. The proportion of oxygen vacancies in the first part 120a may be less than the proportion of oxygen vacancies in each of the second parts 120b.

According to inventive concepts, each of the oxide semiconductor layers 120 may be formed such that the first part 120a may have a thickness less than those of the second parts 120b. A process condition (e.g., process time and/or temperature) of the oxygen supply process OC may be adjusted to control the diffusion of oxygen contained in the oxygen supply layer 110, and thus in each of the oxide semiconductor layers 120, the diffused oxygen may be adjusted to at least partially fill the oxygen vacancies in the first part 120a and the oxygen vacancies in the outer portion 120b2 of each of the second parts 120b and may also be adjusted not to fill or to fill less of the oxygen vacancies in the inner portion 120b1 of each of the second parts 120b. Therefore, the number or proportion of or concentration of oxygen vacancies in the first part 120a of each of the oxide semiconductor layers 120 may be easily adjusted to be less than the respective number or proportion of or concentration of oxygen vacancies in each of the second parts 120b included in each of the oxide semiconductor layers 120, and accordingly it may be possible to more effortlessly improve electrical properties of oxide semiconductor channel transistors including the oxide semiconductor layers 120.

Moreover, vertical channel transistors may be constituted by/correspond to the oxide semiconductor layers 120, the first and second gate electrodes GE1 and GE2, the upper electrodes TE, and the lower electrode BE. Accordingly, it may be possible to more easily achieve high integration of oxide semiconductor channel transistors.

Figure 19:
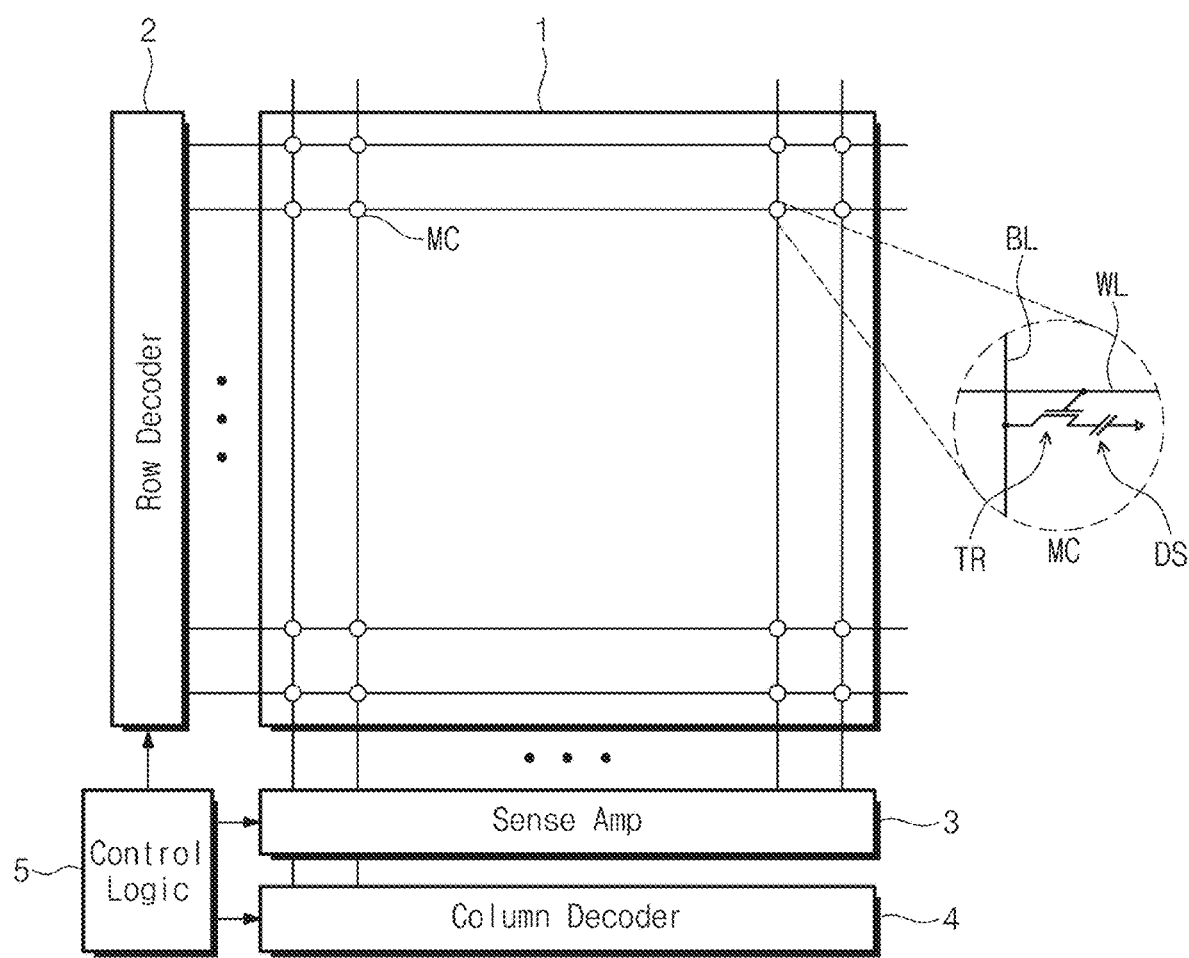
FIG. 19 illustrates a block diagram showing a semiconductor device according to some example embodiments of inventive concepts.

FIG. 19 illustrates a block diagram showing a semiconductor device according to some example embodiments of inventive concepts.

Referring to FIG. 19, a semiconductor device may include a memory cell array 1, a row decoder 2, a sense amplifier 3, a column decoder 4, and a control logic 5.

The memory cell array 1 may include a plurality of memory cells MC that are arranged two- or three-dimensionally. Each of the memory cells MC may be connected between a word line WL (e.g. a row line) and a bit line BL (e.g. a column line) that intersect each other.

Each of the memory cells MC may include a selection element TR and a data storage element DS, and the selection element TR and the data storage element DS may be electrically connected in series. The selection element TR may be connected between the bit line BL and the data storage element DS and may be controlled by the word line WL. For example, the selection element TR may be a field effect transistor (FET), and the data storage element DS may be a capacitor, a magnetic tunnel junction pattern, or a variable resistor. For example, the selection element TR may include a transistor, and a gate electrode of the transistor may be connected to the word line WL. The transistor may have drain/source terminals connected to the bit line BL and the data storage element DS.

The row decoder 2 may decode an address that is input from outside, and may select one of a plurality of word lines WL included in the memory cell array 1. The address that is decoded in the row decoder 2 may be provided to a row driver (not shown), and in response to a control operation of control circuits, the row driver may provide a certain voltage to a selected word line WL and each of non-selected word lines WL.

In response to an address that is decoded from the column decoder 4, the sense amplifier 3 may detect and amplify a voltage difference between a selected bit line BL and a reference bit line, and may then output the amplified voltage difference.

The column decoder 4 may provide a data delivery path between the sense amplifier 3 and an external device (e.g., a memory controller). The column decoder 4 may decode an address that is input from outside, and may select one of a plurality of bit lines BL included in the memory cell array 1.

The control logic 5 may generate control signals that control operations to write data to the memory cell array 1 or to read data from the memory cell array 1.

Figure 20:
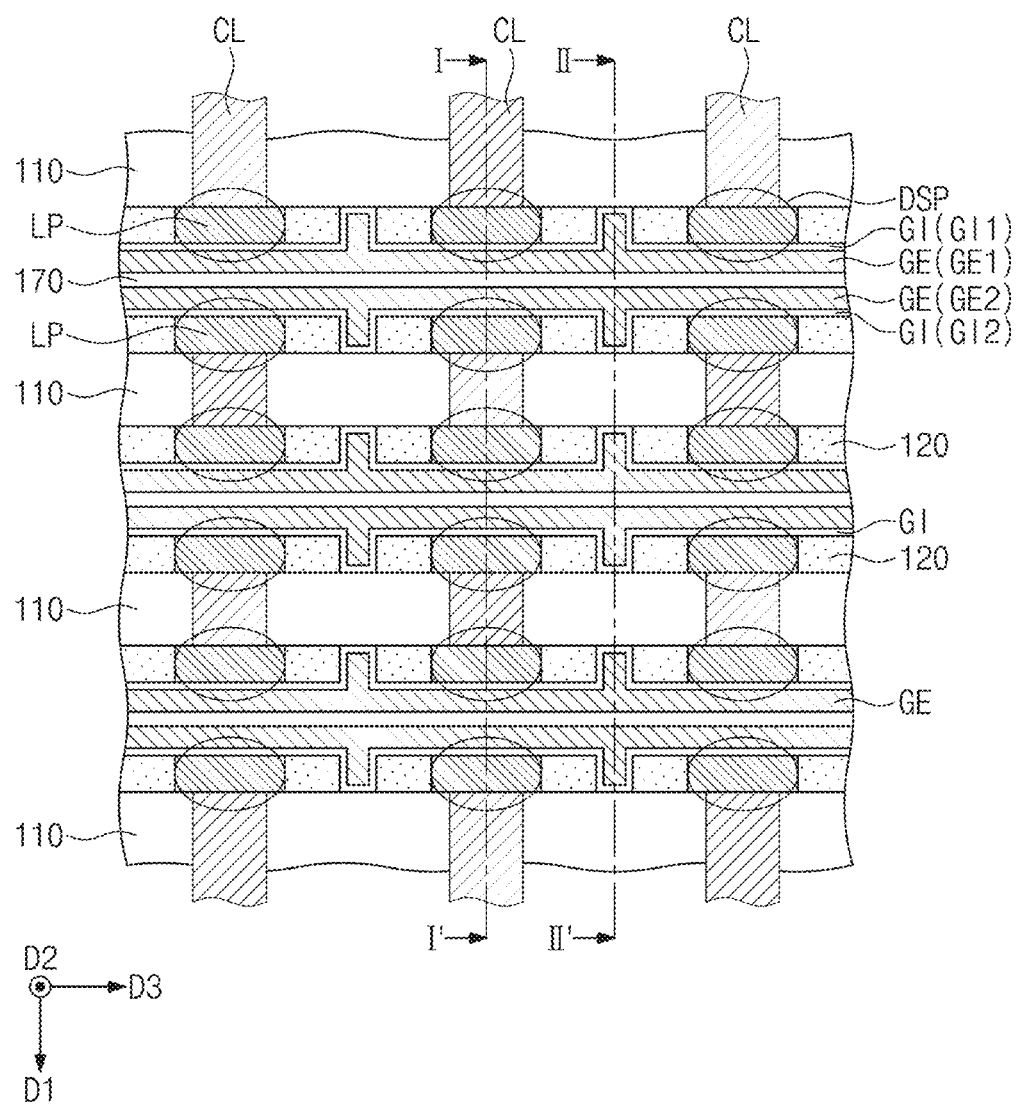
FIG. 20 illustrates a plan view showing a semiconductor device according to some example embodiments of inventive concepts.
Figure 21:
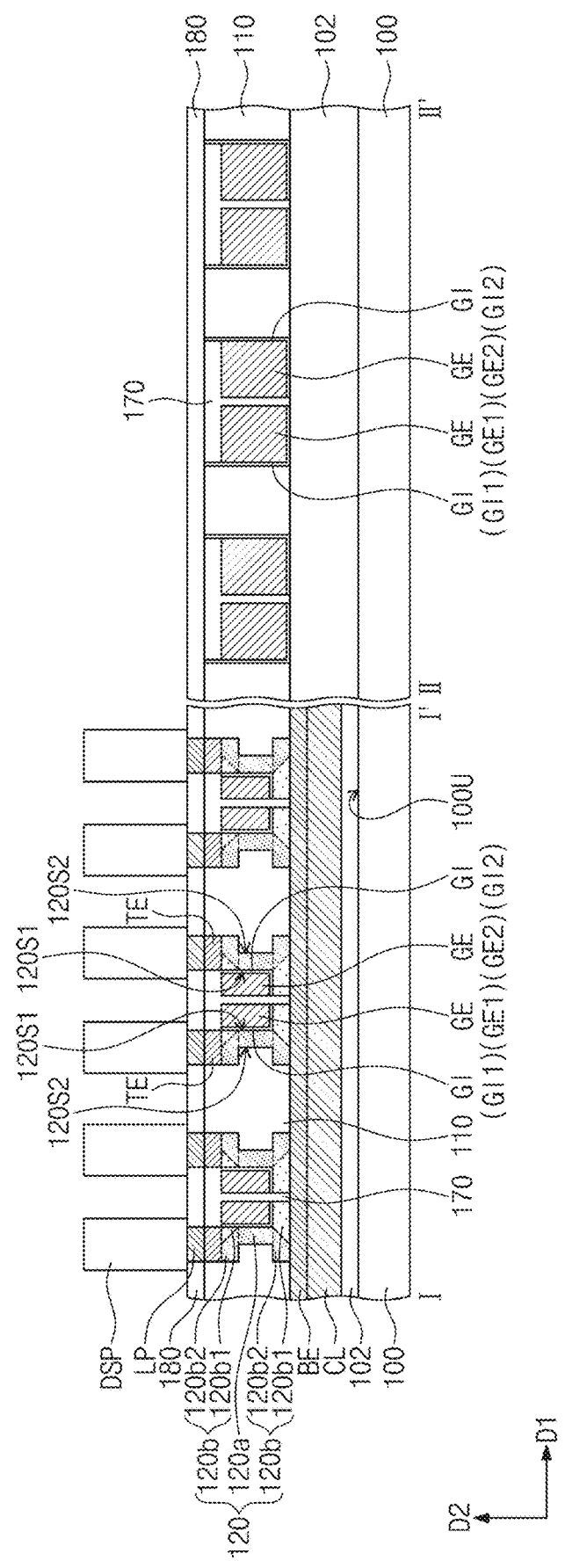
FIG. 21 illustrates a cross-sectional view taken along lines I-I' and II-IF of FIG. 20.

FIG. 20 illustrates a plan view showing a semiconductor device according to some example embodiments of inventive concepts. FIG. 21 illustrates a cross-sectional view taken along lines I-I' and II-IF of FIG. 20.

Referring to FIGS. 20 and 21, a lower dielectric layer 102 may be disposed on a substrate 100. The substrate 100 may be a semiconductor substrate, for example, a silicon (Si) substrate, a germanium (Ge) substrate, a silicon-germanium (SiGe) substrate, or a silicon-on-insulator (SOI) substrate. The lower dielectric layer 102 may include, for example, one or more of silicon oxide, silicon nitride, and silicon oxynitride.

A plurality of conductive lines CL may be disposed in the lower dielectric layer 102. The plurality of conductive lines CL may extend in a first direction D1 parallel to a top surface 100U of the substrate 100, and may be spaced apart from each other in a third direction D3 parallel to the top surface 100U of the substrate 100 while intersecting the first direction D1. A plurality of lower electrodes BE may be correspondingly disposed on the plurality of conductive lines CL. The plurality of lower electrodes BE may be disposed in the lower dielectric layer 102 and may extend in the first direction D1 along top surfaces of the plurality of conductive lines CL. Each of the plurality of conductive lines CL may be substantially the same as the conductive line CL discussed with reference to FIG. 13, and each of the plurality of lower electrodes BE may be substantially the same as the lower electrode BE discussed with reference to FIG. 13. The plurality of conductive lines CL may constitute the bit lines BL of FIG. 19.

The plurality of conductive lines CL may be provided thereon with a plurality of oxide semiconductor layers 120 that are two-dimensionally disposed along the first direction D1 and the third direction D3. The plurality of oxide semiconductor layers 120 may be spaced apart from each other along the first direction D1 and the third direction D3. Each of the plurality of oxide semiconductor layers 120 may have a bar shape that elongates in the third direction D3 and may extend in a second direction D2 perpendicular to the top surface 100U of the substrate 100. Among the plurality of oxide semiconductor layers 120, the oxide semiconductor layers 120 arranged in the third direction D3 may be correspondingly disposed on the plurality of conductive lines CL. Among the plurality of oxide semiconductor layers 120, the oxide semiconductor layers 120 arranged in the first direction D1 may be disposed on a corresponding one of the plurality of conductive lines CL. The plurality of lower electrodes BE may be interposed between the plurality of conductive lines CL and the plurality of oxide semiconductor layers 120.

The plurality of oxide semiconductor layers 120 may include a pair of oxide semiconductor layers 120 that face each other in the first direction D1. The pair of oxide semiconductor layers 120 may be disposed on a corresponding one of the plurality of conductive lines CL and may be spaced apart from each other in the first direction D1. The pair of oxide semiconductor layers 120 may be substantially the same as the pair of oxide semiconductor layers 120 discussed with reference to FIG. 13.

A plurality of gate electrodes GE may lie on and run across the plurality of conductive lines CL. The plurality of gate electrodes GE may extend in the third direction D3 and may be spaced apart from each other in the first direction D1. Among the plurality of oxide semiconductor layers 120, the oxide semiconductor layers 120 arranged in the third direction D3 may be disposed on one side of a corresponding one of the plurality of gate electrodes GE and may be spaced apart from each other in the third direction D3. The corresponding gate electrode GE may extend between the oxide semiconductor layers 120 arranged in the third direction D3. A plurality of gate dielectric patterns GI may be interposed between the plurality of gate electrodes GE and the plurality of oxide semiconductor layers 120. Each of the plurality of gate dielectric patterns GI may extend in the third direction D3 and may be interposed between the corresponding gate electrode GE and the oxide semiconductor layers 120 arranged in the third direction D3. The plurality of gate electrodes GE and the plurality of gate dielectric patterns GI may constitute the word lines WL of FIG. 19.

The plurality of gate electrodes GE may include a first gate electrode GE1 and a second gate electrode GE2 that are disposed between the pair of oxide semiconductor layers 120, and the plurality of gate dielectric patterns GI may include a first gate dielectric pattern GI1 and a second gate dielectric pattern GI2 that are disposed between the pair of oxide semiconductor layers 120. The first gate electrode GE1 and the second gate electrode GE2 may be spaced apart from each other in the first direction D1 between the pair of oxide semiconductor layers 120. The first gate dielectric pattern GI1 may be interposed between the first gate electrode GE1 and one of the pair of oxide semiconductor layers 120, and the second gate dielectric pattern GI2 may be interposed between the second gate electrode GE2 and other of the pair of oxide semiconductor layers 120. The first gate electrode GE1, the second gate electrode GE2, the first gate dielectric pattern GI1, and the second gate dielectric pattern GI2 may be substantially the same as the first gate electrode GE1, the second gate electrode GE2, the first gate dielectric pattern GI1, and the second gate dielectric pattern GI2 that are discussed with reference to FIG. 13.

Each of the plurality of oxide semiconductor layers 120 may have an inner surface 120S1 and an outer surface 120S2 that are opposite to each other in the first direction D1. Among the plurality of oxide semiconductor layers 120, the inner surface 120S1 of one of the pair of oxide semiconductor layers 120 may face the inner surface 120S1 of the other of the pair of oxide semiconductor layers 120. The first and second gate electrodes GE1 and GE2 may be correspondingly disposed on the inner surfaces 120S1 of the pair of oxide semiconductor layers 120. The first gate dielectric pattern GI1 may be interposed between the first gate electrode GE1 and the inner surface 120S1 of one of the pair of oxide semiconductor layers 120, and the second gate dielectric pattern GI2 may be interposed between the second gate electrode GE2 and the inner surface 120S1 of the other of the pair of oxide semiconductor layers 120.

A separation dielectric pattern 170 may be interposed between the first and second gate electrodes GE1 and GE2 and may extend in the third direction D3. The separation dielectric pattern 170 may extend between the first and second gate dielectric patterns GI1 and GI2 and between the pair of oxide semiconductor layers 120, and may contact the lower electrode BE between the pair of oxide semiconductor layers 120. The separation dielectric pattern 170 may be interposed between the inner surfaces 120S1 of the pair of oxide semiconductor layers 120.

A plurality of upper electrodes TE may be correspondingly disposed on the plurality of oxide semiconductor layers 120 and may be spaced apart from each other along the first direction D1 and the third direction D3. The upper electrodes TE may be correspondingly connected to the plurality of oxide semiconductor layers 120. The separation dielectric pattern 170 may extend between the upper electrodes TE that are correspondingly disposed on the pair of oxide semiconductor layers 120. The separation dielectric pattern 170 and the upper electrodes TE may be substantially the separation dielectric pattern 170 and the upper electrodes TE that are discussed with reference to FIG. 13.

An oxygen supply layer 110 may be disposed to cover the outer surface 120S2 of each of the pair of oxide semiconductor layers 120. The oxygen supply layer 110 may extend in the third direction D3 and may cover the outer surfaces 120S2 of the oxide semiconductor layers 120 arranged in the third direction D3. The oxygen supply layer 110 may be substantially the same as the oxygen supply layer 110 discussed with reference to FIG. 13.

Each of the plurality of oxide semiconductor layers 120, a corresponding gate electrode GE, a corresponding upper electrode TE, and the lower electrode BE may constitute a vertical channel transistor or the selection element TR of FIG. 19.

An upper dielectric layer 180 may be disposed on the oxygen supply layer 110 and the separation dielectric pattern 170. The upper dielectric layer 180 may include, for example, one or more of silicon oxide, silicon nitride, and silicon oxynitride. The upper dielectric layer 180 may be provided therein with landing pads LP connected to corresponding upper electrodes TE. The landing pads LP may penetrate the upper dielectric layer 180 and may be correspondingly connected to the upper electrodes TE. When viewed in plan, the landing pads LP may each have a circular shape, an oval shape, a rectangular shape, a square shape, a rhombic shape, a hexagonal shape, or any suitable shapes. The landing pads LP may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

A plurality of data storage patterns DSP may be correspondingly disposed on the landing pads LP. The data storage patterns DSP may be correspondingly have electrical connection through the landing pads LP with the upper electrodes TE. The data storage patterns DSP may be spaced apart from each other along the first direction D1 and the third direction D3. According to some example embodiments, each of the data storage patterns DSP may be a capacitor. In this case, each of the data storage patterns DSP may include a bottom electrode, a top electrode, and a capacitor dielectric layer between the bottom and top electrodes. The bottom electrode may be disposed on a corresponding one of the landing pads LP, and when viewed in plan, may have a circular shape, an oval shape, a rectangular shape, a square shape, a rhombic shape, a hexagonal shape, or any suitable shapes. According to some example embodiments, each of the data storage patterns DSP may be a variable resistance pattern that is switched between two resistance states. In this case, each of the data storage patterns DSP may include, for example, a phase change material or a magnetic tunnel junction pattern. The data storage patterns DSP may constitute the data storage element DS of FIG. 19.

According to inventive concepts, an oxide semiconductor layer may include a first part and second parts that are spaced apart from each other across the first part. A gate electrode may be disposed on the first part of the oxide semiconductor layer, and electrodes may be disposed on corresponding second parts of the oxide semiconductor layer. The oxide semiconductor layer, the gate electrode, and the electrodes may constitute an oxide semiconductor channel transistor. As the first part of the oxide semiconductor layer has a relatively small number of or concentration of oxygen vacancies, the oxide semiconductor channel transistor may improve in swing characteristics. As the second parts of the oxide semiconductor layer have relatively large number of or concentration of oxygen vacancies, the electrodes may improve in resistance characteristics. There may be provided a semiconductor device including an oxide semiconductor channel transistor with improved electrical properties and a method of fabricating the semiconductor device.

Alternatively or additionally, the oxide semiconductor layer, the gate electrode, and the electrodes may constitute a vertical channel transistor. Accordingly, there may be provided a semiconductor device including an oxide semiconductor channel transistor capable of easily achieving high integration and a method of fabricating the semiconductor device.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The aforementioned description provides some example embodiments for explaining inventive concepts. Therefore, inventive concepts are not limited to various example embodiments described above, and it will be understood by one of ordinary skill in the art that variations in form and detail may be made therein without departing from the spirit and essential features of inventive concepts. Furthermore example embodiments are not necessarily mutually exclusive with one another. For example, some example embodiments may include one or more features described with reference to one or more drawings, and may also include one or more features described with reference to one or more other drawings.

What is claimed is:

1. A semiconductor device, comprising:
an oxide semiconductor layer on a substrate, the oxide semiconductor layer including
a first part and a pair of second parts, and
each of the second parts of the pair of second parts are spaced apart from each other across the first part;
a gate electrode on the first part of the oxide semiconductor layer; and
a pair of electrodes on corresponding second parts of the pair of second parts,
wherein a first thickness of the first part of the oxide semiconductor layer is less than a second thickness of each of the second parts, and
a concentration of oxygen vacancies in the first part of the oxide semiconductor layer is less than a concentration of oxygen vacancies in each of the second parts,
wherein a bottom surface of the first part is at a same height as that of a bottom surface of each of the second parts, and
wherein the oxide semiconductor layer is a single layer including of one or more of amorphous oxide semiconductor, crystalline oxide semiconductor and polycrystalline oxide semiconductor.

2. The semiconductor device of claim 1, further comprising:
a gate dielectric pattern between the gate electrode and the first part of the oxide semiconductor layer.

3. The semiconductor device of claim 1, further comprising:
an oxygen supply layer on the substrate and adjacent to the oxide semiconductor layer,
wherein, in each of the second parts, a concentration of oxygen vacancies in a portion distant from the oxygen supply layer is greater than a concentration of oxygen vacancies in another portion adjacent to the oxygen supply layer.

4. The semiconductor device of claim 3, wherein the oxygen supply layer includes an oxygen-containing dielectric material.

5. The semiconductor device of claim 1, wherein
each of the second parts are spaced apart from each other along a first direction parallel to a top surface of the substrate,
each electrode of the pair of electrodes are contact electrodes on the corresponding second parts, and
the first thickness and the second thickness are measured along a second direction perpendicular to the top surface of the substrate.

6. The semiconductor device of claim 5, wherein a top surface of the first part of the oxide semiconductor layer is at a height lower than a height of a top surface of each of the second parts.

7. The semiconductor device of claim 5, further comprising:
an oxygen supply layer between the substrate and the oxide semiconductor layer,
wherein each of the second parts includes a lower portion adjacent to the oxygen supply layer and an upper portion distant from the oxygen supply layer,
a concentration of oxygen vacancies in the lower portion of each of the second parts is less than a concentration of oxygen vacancies in the upper portion of each of the second parts.

8. The semiconductor device of claim 7, wherein the concentration of oxygen vacancies in the first part of the oxide semiconductor layer is less than the concentration of oxygen vacancies in the upper portion of each of the second parts.

9. The semiconductor device of claim 7, wherein each of the contact electrodes is on the upper portion of each of the second parts.

10. A semiconductor device, comprising:
an oxide semiconductor layer on a substrate, the oxide semiconductor layer including
a first part and a pair of second parts, and
each of the second parts of the pair of second parts are spaced apart from each other across the first part;
a gate electrode on the first part of the oxide semiconductor layer; and
a pair of electrodes on corresponding second parts of the pair of second parts,
wherein a first thickness of the first part of the oxide semiconductor layer is less than a second thickness of each of the second parts, and
a concentration of oxygen vacancies in the first part of the oxide semiconductor layer is less than a concentration of oxygen vacancies in each of the second parts,
wherein each of the second parts are spaced apart from each other along a second direction perpendicular to a top surface of the substrate,
each electrode of the pair of electrodes include a lower electrode and an upper electrode that are correspondingly adjacent to each of the second parts, and
the first thickness and the second thickness are measured along a first direction parallel to the top surface of the substrate.

11. The semiconductor device of claim 10, wherein
each of the second parts are horizontal parts that extend in the first direction, and
the first part of the oxide semiconductor layer is a vertical part that extends in the second direction between each of the second parts.

12. The semiconductor device of claim 10, wherein
the oxide semiconductor layer has an inner surface and an outer surface that are opposite to each other in the first direction,
the gate electrode is on the inner surface of the oxide semiconductor layer, and
the semiconductor device further comprises an oxygen supply layer that covers the outer surface of the oxide semiconductor layer.

13. The semiconductor device of claim 12, wherein each of the second parts protrude along the first direction from the outer surface of the first part of the oxide semiconductor layer.

14. The semiconductor device of claim 13, wherein outer surfaces of each of the second parts are offset along the first direction from the outer surface of the first part of the oxide semiconductor layer.

15. The semiconductor device of claim 12, wherein each of the second parts includes an outer portion adjacent to the oxygen supply layer and an inner portion distant from the oxygen supply layer,
wherein a concentration of oxygen vacancies in the outer portion of each of the second parts is less than a concentration of oxygen vacancies in the inner portion of each of the second parts.

16. The semiconductor device of claim 15, wherein the concentration of oxygen vacancies in the first part of the oxide semiconductor layer is less than the concentration of oxygen vacancies in the inner portion of each of the second parts.

17. The semiconductor device of claim 12, further comprising:
a gate dielectric pattern between the gate electrode and the inner surface of the oxide semiconductor layer.

18. The semiconductor device of claim 10, further comprising:
a gate dielectric pattern between the gate electrode and the first part of the oxide semiconductor layer.

19. The semiconductor device of claim 10, further comprising:
an oxygen supply layer on the substrate and adjacent to the oxide semiconductor layer,
wherein, in each of the second parts, a concentration of oxygen vacancies in a portion distant from the oxygen supply layer is greater than a concentration of oxygen vacancies in another portion adjacent to the oxygen supply layer.

20. The semiconductor device of claim 19, wherein
the oxygen supply layer includes an oxygen-containing dielectric material.

* * * * *